(12) United States Patent
Asami et al.

(10) Patent No.: US 7,208,394 B2
(45) Date of Patent: Apr. 24, 2007

(54) METHOD OF MANUFACTURING A SEMICONDUCTOR DEVICE WITH A FLUORINE CONCENTRATION

(75) Inventors: Taketomi Asami, Kanagawa (JP);
Mitsuhiro Ichijo, Kanagawa (JP);
Satoshi Toriumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/042,352

(22) Filed: Jan. 24, 2005

(65) Prior Publication Data
US 2005/0202602 A1    Sep. 15, 2005

Related U.S. Application Data

(63) Continuation of application No. 09/900,672, filed on Jul. 6, 2001, now Pat. No. 6,875,674.

(30) Foreign Application Priority Data
Jul. 10, 2000    (JP)    ............................... 2000-209136

(51) Int. Cl.
*H01L 21/20* (2006.01)
(52) U.S. Cl. .................. 438/482; 438/149; 438/166; 257/E21.324
(58) Field of Classification Search ................ 438/482, 438/149, 166; 257/E21.324
See application file for complete search history.

(56) References Cited
U.S. PATENT DOCUMENTS

| 4,441,973 A | 4/1984 | Noguchi ...................... 438/485 |
| 4,569,697 A | 2/1986 | Tsu et al. ...................... 438/96 |
| 4,634,601 A | 1/1987 | Hamakawa et al. ........ 438/485 |
| 5,296,258 A | 3/1994 | Tay et al. .................... 438/322 |
| 5,326,723 A | 7/1994 | Petro et al. .................. 438/685 |
| 5,391,410 A | 2/1995 | Nii et al. ..................... 427/578 |
| 5,643,826 A | 7/1997 | Ohtani et al. ................. 437/88 |
| 5,650,013 A | 7/1997 | Yamazaki .................... 118/723 |
| 5,766,344 A | 6/1998 | Zhang et al. ................ 117/103 |
| 5,821,138 A | 10/1998 | Yamazaki et al. .......... 438/166 |

(Continued)

FOREIGN PATENT DOCUMENTS

JP    06-232059    8/1994

(Continued)

OTHER PUBLICATIONS

Specification, claims and drawings of U.S. Appl. No. 08/823,608, filed Mar. 24, 1997 (now abandoned).

*Primary Examiner*—Michael Lebentritt
*Assistant Examiner*—Stanetta Isaac
(74) *Attorney, Agent, or Firm*—Cook, Alex, McFarron, Manzo, Cummings & Mehler, Ltd.

(57) ABSTRACT

At present, a forming process of a base film through an amorphous silicon film is conducted in respective film forming chambers in order to obtain satisfactory films. When continuous formation of the base film through the amorphous silicon film is performed in a single film forming chamber with the above film formation condition, crystallization is not sufficiently attained in a crystallization process. By forming the amorphous silicon film using silane gas diluted with hydrogen, crystallization is sufficiently attained in the crystallization process even with the continuous formation of the base film through the amorphous silicon film in the single film forming chamber.

26 Claims, 19 Drawing Sheets

U.S. PATENT DOCUMENTS

| | | | |
|---|---|---|---|
| 5,843,225 A | 12/1998 | Takayama et al. | 117/8 |
| 5,858,823 A | 1/1999 | Yamazaki et al. | 438/166 |
| 5,923,962 A | 7/1999 | Ohtani et al. | 438/150 |
| 5,938,839 A | 8/1999 | Zhang | 117/104 |
| 5,942,050 A | 8/1999 | Green et al. | 136/258 |
| 5,953,597 A | 9/1999 | Kusumoto et al. | 438/161 |
| 5,968,279 A | 10/1999 | MacLeish et al. | 134/1.2 |
| 5,985,704 A * | 11/1999 | Adachi et al. | 438/166 |
| 6,020,035 A * | 2/2000 | Gupta et al. | 427/534 |
| 6,033,973 A | 3/2000 | Takemura | 438/514 |
| 6,087,679 A | 7/2000 | Yamazaki et al. | 257/65 |
| 6,107,639 A | 8/2000 | Yamazaki et al. | 257/49 |
| 6,156,627 A | 12/2000 | Zhang et al. | 438/486 |
| 6,162,667 A | 12/2000 | Funai et al. | 438/166 |
| 6,177,302 B1 | 1/2001 | Yamazaki et al. | 438/158 |
| 6,180,438 B1 | 1/2001 | Deane et al. | 438/149 |
| 6,204,099 B1 | 3/2001 | Kusumoto et al. | 438/151 |
| 6,221,701 B1 * | 4/2001 | Yamazaki | 438/166 |
| 6,261,877 B1 | 7/2001 | Yamazaki et al. | 438/151 |
| 6,265,745 B1 | 7/2001 | Kusumoto et al. | 257/350 |
| 6,361,912 B2 | 3/2002 | Fonash et al. | 430/52 |
| 6,375,756 B1 * | 4/2002 | Ishibashi | 134/19 |
| 6,376,333 B1 | 4/2002 | Yamazaki et al. | 438/458 |
| 6,468,927 B1 * | 10/2002 | Zhang et al. | 438/779 |
| 6,541,354 B1 * | 4/2003 | Shimoda et al. | 438/478 |
| 6,657,376 B1 | 12/2003 | Raina et al. | 313/496 |
| 6,758,224 B2 * | 7/2004 | Nogami | 134/22.1 |
| 6,767,836 B2 * | 7/2004 | San et al. | 438/710 |
| 6,784,957 B2 | 8/2004 | Kanou et al. | 349/113 |
| 6,872,323 B1 * | 3/2005 | Entley et al. | 216/67 |
| 6,903,025 B2 * | 6/2005 | Mizushima | 438/706 |
| 2003/0143410 A1 * | 7/2003 | Won et al. | 428/448 |

FOREIGN PATENT DOCUMENTS

JP 07-130652 5/1995

* cited by examiner

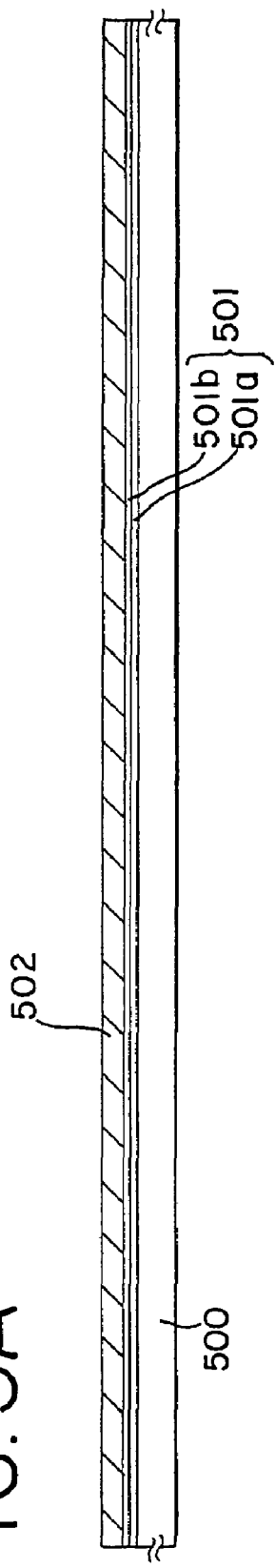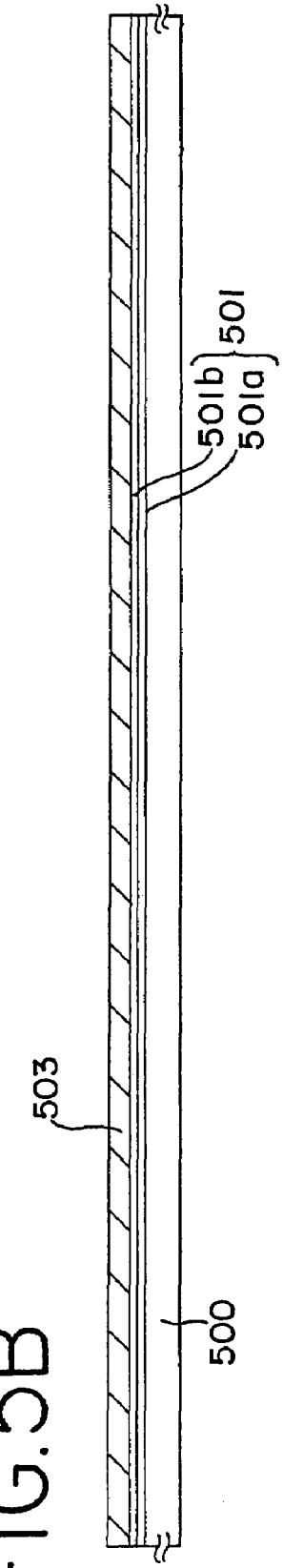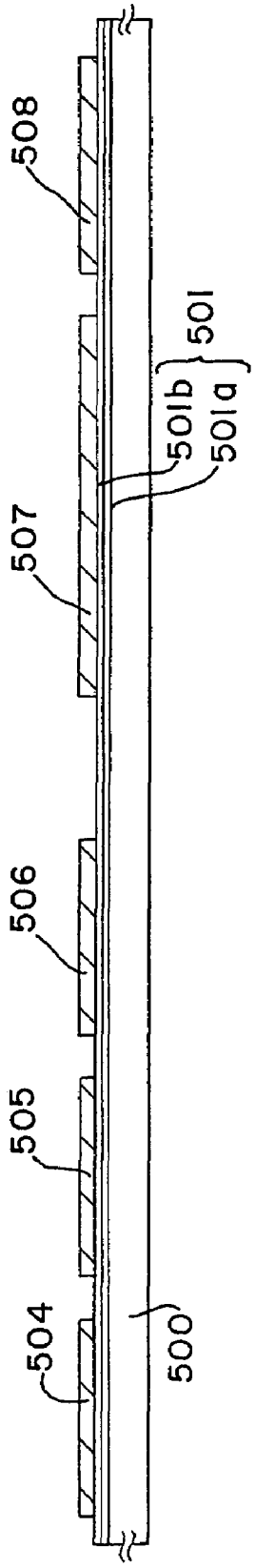

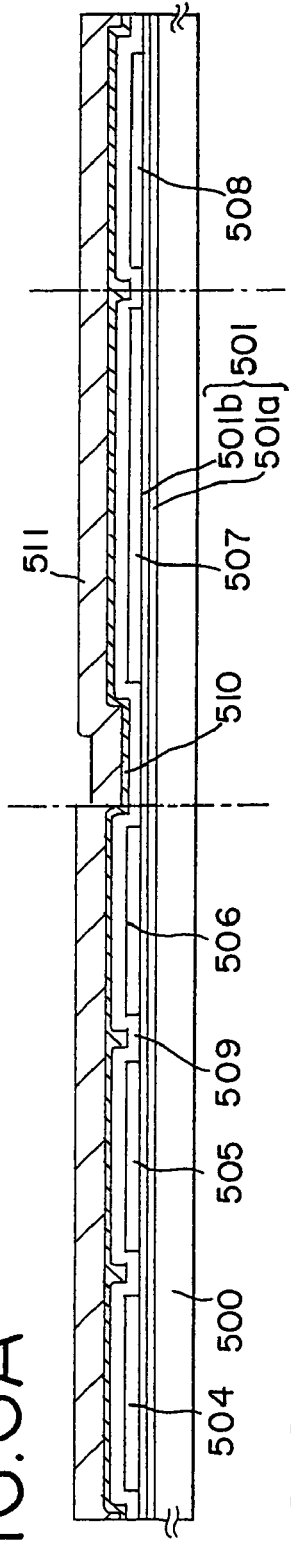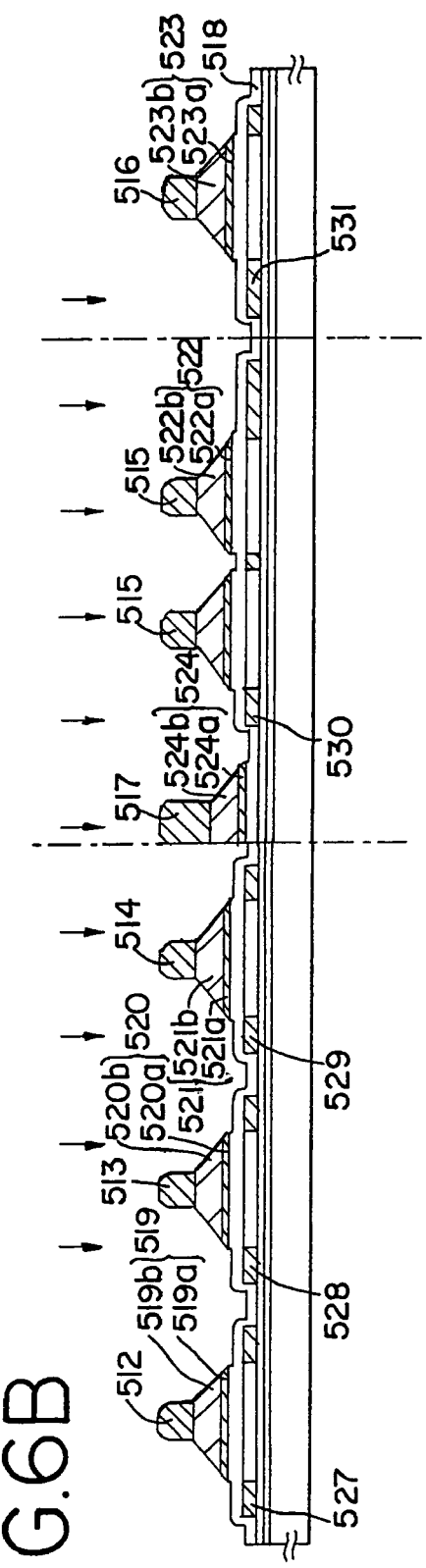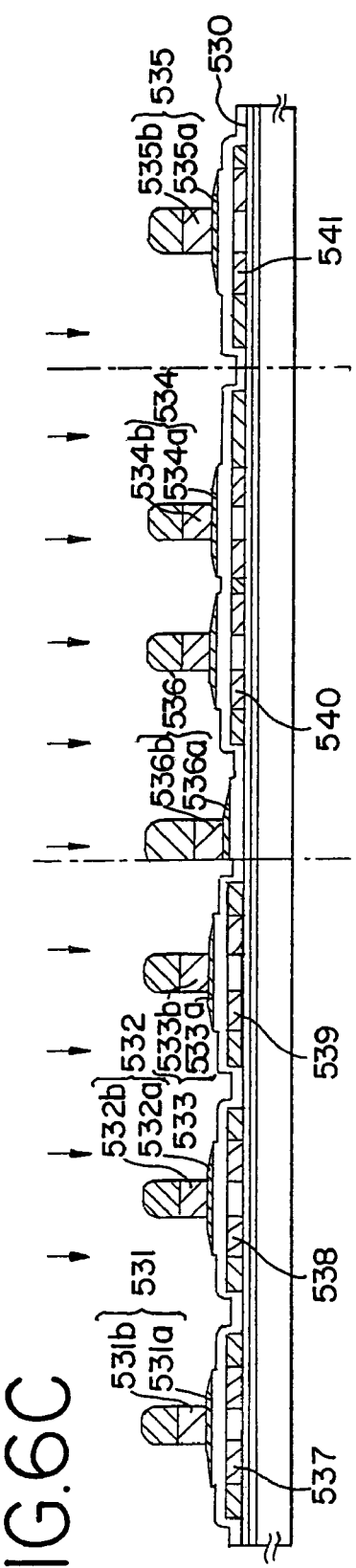

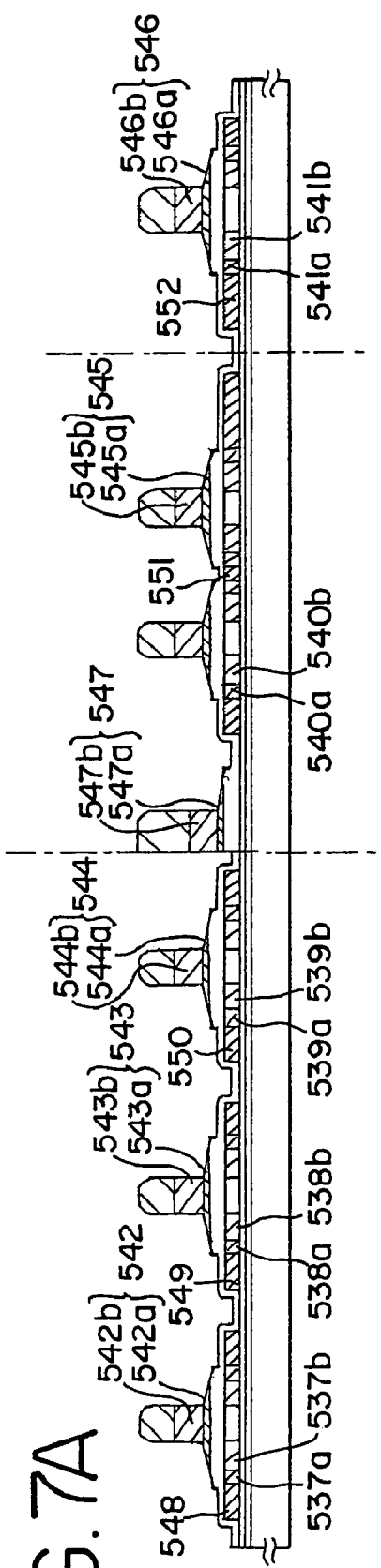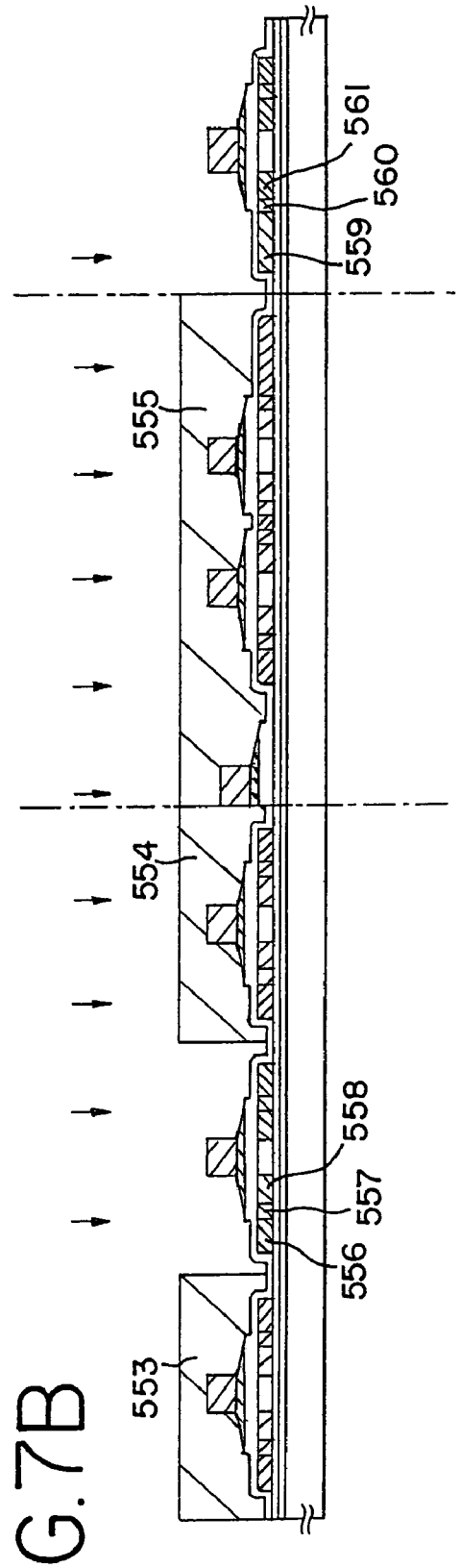
FIG. 7A
FIG. 7B

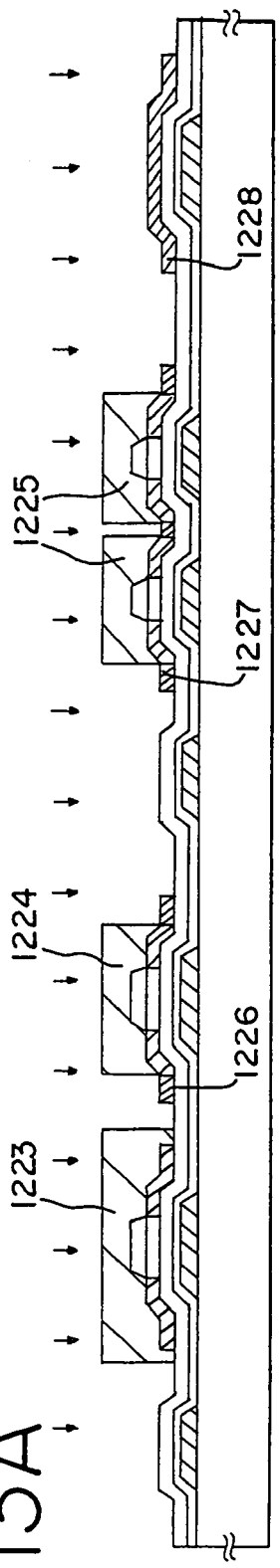
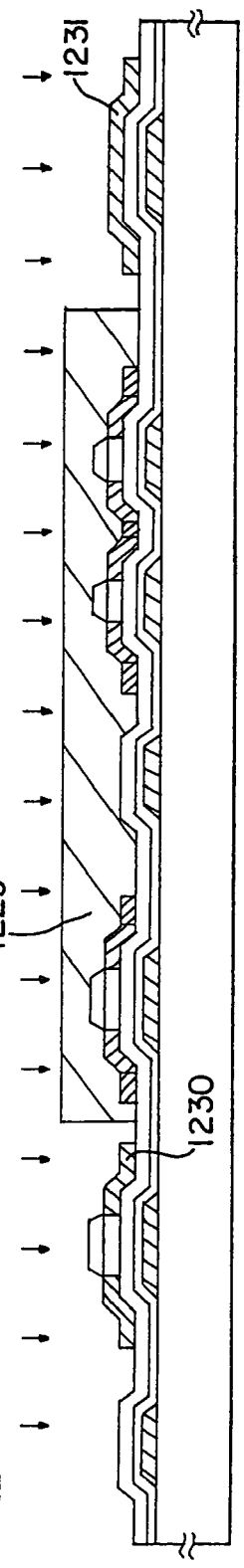
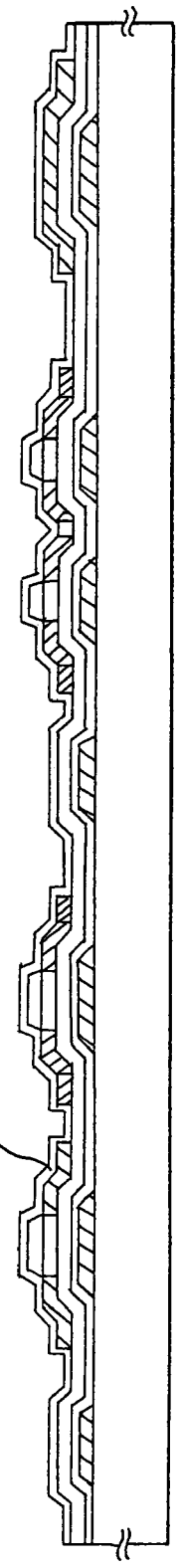
FIG.13A
FIG.13B
FIG.13C

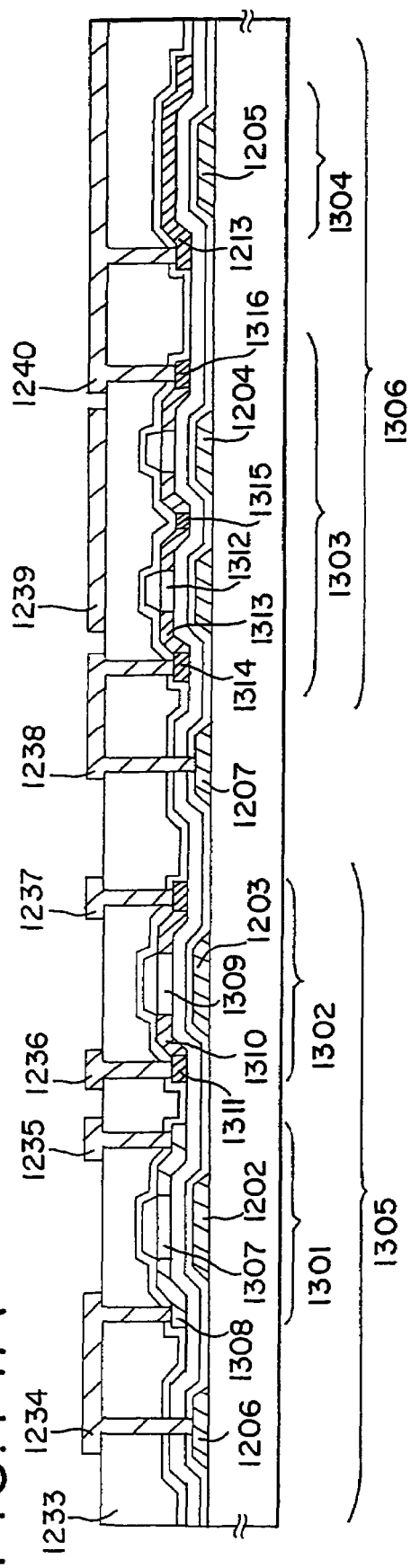
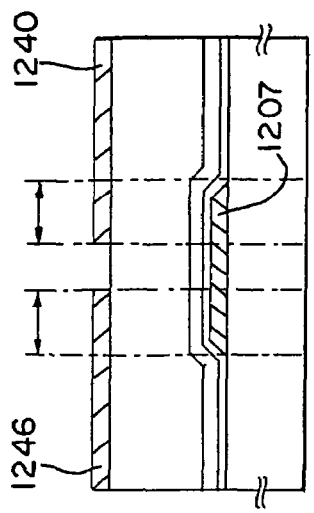
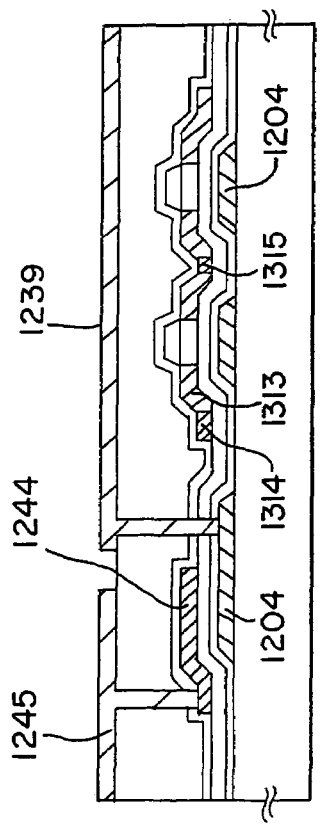
FIG. 14A
FIG. 14C
FIG. 14B

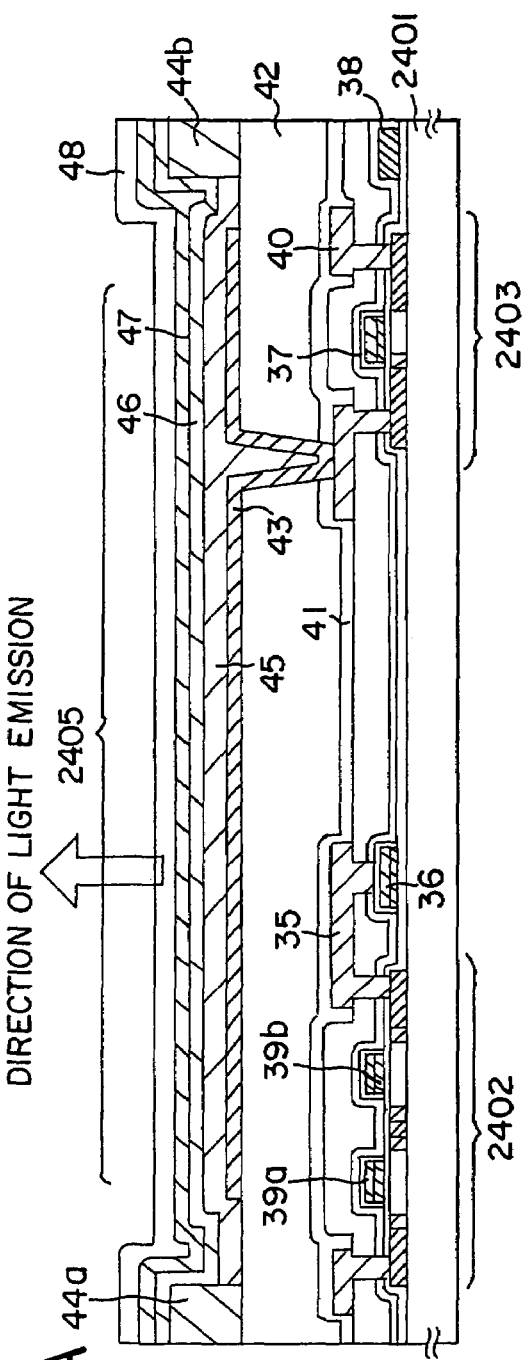
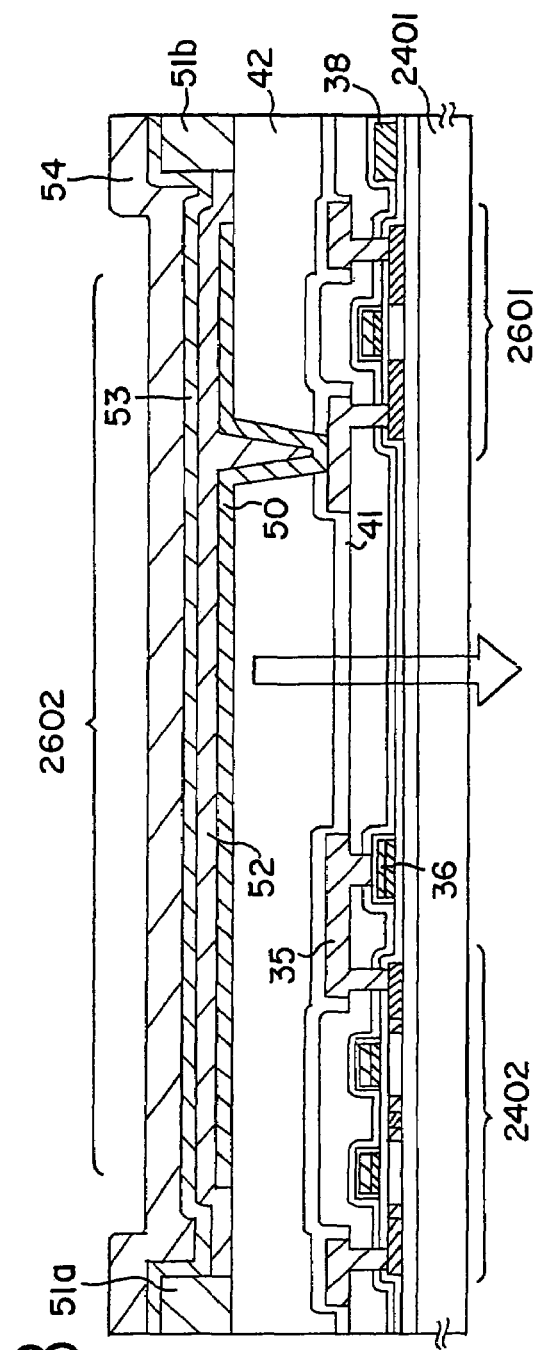

METHOD OF MANUFACTURING A SEMICONDUCTOR DEVICE WITH A FLUORINE CONCENTRATION

This application is a continuation of U.S. application Ser. No. 09/900,672, filed on Jul. 6, 2001 now U.S. Pat. No. 6,875,674.

BACKGROUND OF THE INVENTION

1. Field of the Invention

The present invention relates to a method of manufacturing a semiconductor device constituted of semiconductor elements typified by thin film transistors (hereinafter referred to as TFTs) using a crystalline semiconductor film formed on a substrate. Semiconductor devices manufactured in accordance with the present invention include not only elements such as a TFT and a MOS transistor but also a liquid crystal display device having a semiconductor circuit constituted of the above insulating gate type transistors (a microprocessor, a signal processing circuit, a high frequency circuit or the like), an EL (electro luminescence) display device, an EC (electro chromic) display device, an image sensor, and the like.

2. Description of the Related Art

At present, TFTs are used in integrated circuits as semiconductor elements using a semiconductor film, and particularly, as switching elements of an image display device. Further, TFTs in which a crystalline semiconductor film with higher mobility than that of an amorphous semiconductor film used in active layers have high driving ability, and are used also as elements of a driver circuit.

In the present situation, an amorphous silicon film or a crystalline silicon film (also referred to as a polysilicon film) is mainly used as active layers.

As a method of obtaining a crystalline silicon film, a method of performing a heating process, a laser annealing method, and a technique disclosed in Japanese Patent Application Laid-open Nos. Hei 6-232059 and Hei 7-130652 by applicants of the present invention are known. The technique disclosed in these applications is such that a crystalline silicon film with excellent crystallinity can be formed by conducting a heating process at 500 to 600° C. for about 4 hours utilizing a metal element (particularly, nickel) that promotes crystallization of silicon.

Furthermore, in recent years, low-priced glass has been used for a substrate in order to manufacture a display device with a large screen at a low price. In order to prevent contamination due to an alkali metal element such as sodium (Na) contained in this glass substrate, a base film formed of an inorganic insulating film such as a silicon oxide film, a silicon nitride film or a silicon oxide nitride film is provided between an amorphous silicon film and the glass substrate.

In general, in a case where the above base film is formed, oxygen gas or nitrogen gas is used as material gas, and on the other hand, in a case where the amorphous silicon film is formed, only silane ($SiH_4$) gas is used as material gas. Accordingly, in order to obtain a satisfactory amorphous silicon film, a film forming chamber for a base film and a film forming chamber for an amorphous silicon film needs to be formed in lamination. Thus, a plurality of film formation chambers or film forming devices are provided, and film formation is performed in the respective dedicated chambers. Therefore, because a substrate is conveyed, there have been problems such as the increase in process time and the reduction in yield due to conveyance trouble.

Further, even if continuous formation (formation of lamination by continuously forming films without exposure to an atmosphere) from the formation of the base film through the formation of the amorphous silicon film can be performed in a single chamber, since the amorphous silicon film formed in the single chamber contains a large amount of impurities such as oxygen, nitrogen and fluorine which are factors of obstructing crystallization, it has been difficult to obtain a satisfactory crystalline silicon film by using a known crystallization technique.

SUMMARY OF THE INVENTION

The present invention has been made in view of the above, and an object of the present invention is therefore to obtain a satisfactory crystalline silicon film by performing continuous formation from the formation of a base film through the formation of an amorphous silicon film in a single film forming chamber and crystallizing the amorphous silicon film by a known crystallization method.

In order to solve the above object, the present invention is characterized in that $SiH_4$ gas (also referred to as silane gas) diluted with hydrogen is used as material gas for the formation of an amorphous silicon film. Further, disilane gas may be used instead of silane gas.

In the present invention, the continuous formation of three layers of a base silicon oxide nitride film (A), a base silicon oxide nitride film (B), and an amorphous silicon film is conducted. The base silicon oxide nitride film (A) exhibits a high blocking effect against alkali metal ions and the like from a glass substrate, which is an advantage of a silicon nitride film. On the other hand, the base silicon oxide nitride film (B) exhibits advantages of a silicon oxide film such as a wide band gap, a high insulating property, and a low trap level.

An experiment was performed, in which the case where an amorphous silicon film is formed with only conventional $SiH_4$ gas (condition 1) and the case where an amorphous silicon film is formed with $SiH_4$ gas diluted with hydrogen according to the present invention (condition 2) are compared under the same film formation condition of the base silicon oxide nitride film (A) and the base silicon oxide nitride film (B). The respective film formation conditions are shown in Table 1.

Next, nickel (Ni), which is a catalyst element that promotes crystallization, is added in order to crystallize the amorphous silicon film formed in accordance with the conditions. As an adding method, the addition of Ni (aqueous solution containing Ni) by a spinner and the addition of Ni by a plasma method are respectively performed. Then, a heating process was performed for approximately four hours at 500 to 600° C., and Raman spectroscopy was conducted. FIG. 3 shows the results of samples crystallized by the addition of Ni by the plasma method. The sample in which a film is formed in accordance with the condition (2) of the present invention exhibits only a sharp peak of crystalline silicon (in the vicinity of 520 $cm^{-1}$) as shown in FIG. 3B, and it is confirmed that crystallization sufficiently occurs. On the other hand, the sample in which a film is formed in accordance with the conventional condition (1) exhibits both a sharp peak of crystalline silicon (in the vicinity of 520 $cm^{-1}$) and a broad peak of amorphous silicon (in the vicinity of 480 $cm^{-1}$) as shown in FIG. 3A, and it is understood that crystallization is insufficient. From the above experimental results, it was confirmed that the present invention, in which $SiH_4$ gas diluted with hydrogen was used in the formation of an amorphous silicon film, was effective in order to obtain a satisfactory crystalline silicon film by crystallization.

Although not shown in the figure here, sufficient crystallization did not occur with the respective film formation conditions with respect to the addition of Ni by a spinner. That is, the addition of Ni by a plasma method is effective in crystallization as an adding method. Accordingly, in the present invention, it is desirable that an element (Ni or the like) that promotes crystallization of an amorphous silicon film is added by the plasma method. Further, the addition may be conducted with a sputtering method using a metal element (Ni or the like) that promotes crystallization of an amorphous silicon film as a target.

FIGS. 4A and 4B show the results of examination of concentrations of oxygen, nitrogen, and fluorine in the respective amorphous silicon films formed in accordance with the conditions (1) in FIG. 4A and (2) in FIG. 4B with secondary ion mass spectrometry (SIMS spectrometry). Under both the conditions (1) and (2), oxygen concentration and nitrogen concentration are in a range of $1.5\times10^{20}$ to $4.5\times10^{20}$ atoms/cm$^3$ and a range of $2\times10^{19}$ to $4\times10^{19}$ atoms/cm$^3$, respectively, and there was almost no difference in both the conditions with regard to these elements. However, there was a large difference in fluorine concentration between the condition (1) and the condition (2). The fluorine concentration with the condition (1) was approximately $9\times10^{18}$ atoms/cm$^3$, whereas the fluorine concentration with the condition (2) was $4\times10^{17}$ atoms/cm$^3$, which was one digit smaller compared with the condition (1).

Further, for comparison, the above experimental results are compared with the case where an amorphous silicon film and a base silicon oxide nitride film are formed in separate film forming chambers (not shown). The concentrations of oxygen elements and nitrogen elements were about one to two digits lower in the case where an amorphous silicon film and a base silicon oxide nitride film are formed in separate film forming chambers. On the other hand, with respect to fluorine elements, substantially the same concentration was exhibited both in the case where a base silicon oxide nitride film and an amorphous silicon film are formed in separate film forming chambers and in the case where the films are formed in a single film forming chamber in accordance with the condition (2).

From the above results, the inventors of the present invention found that, in crystallization of an amorphous silicon film, the contents of oxygen elements and nitrogen elements in the amorphous silicon film are not so large issues and that the content of fluorine elements is what largely influences the crystallization. Generally, cleaning is performed using fluorine compound gas such as ClF$_3$ or NF$_3$ in a film forming chamber for forming a silicon-based film. Therefore, fluorine remains while being adhered to inner walls and the like of the film forming chamber. The inside of the film forming chamber is generally coated before film formation in order to prevent the residual fluorine from being taken into the film. In this experiment, the film formation is performed in the state that the film forming chamber has been coated with a thickness of 3 μm or more, but the amount of fluorine contained in an amorphous silicon film was large in case of the film formation of the amorphous silicon film performed with only SiH$_4$ gas. However, according to the present invention, the amount of fluorine taken into the film can be suppressed by forming an amorphous silicon film using SiH$_4$ gas diluted with hydrogen. Further, a sufficiently crystallized silicon film can be obtained by crystallizing the amorphous silicon film. Consequently, according to the present invention, coating processing time after cleaning can be shortened, and thus, a reduction in process time can be expected.

According to the present invention disclosed in this specification, there is provided a method of manufacturing a semiconductor device comprising:

a first step of forming an insulating film on a substrate in a film forming chamber after the inside of the film forming chamber is cleaned with fluorine compound gas;

a second step of introducing silane gas diluted with hydrogen in the film forming chamber to generate plasma and forming an amorphous silicon film with fluorine concentration of $1\times10^{18}$ atoms/cm$^3$ or less on the insulating film;

a third step of adding an element that promotes crystallization of the amorphous silicon film to the amorphous silicon film; and a fourth step of crystallizing the amorphous silicon film by conducting a heating process, characterized in that after the first step, the second step is conducted without exposure to an atmosphere.

Further, in the above structure, a fifth step of irradiating laser light to the crystallized silicon film may be added after the fourth step.

In the above structure, it is characterized in that the ratio of the flow rate of silane gas and the flow rate of hydrogen gas in the second step is 1:2 to 1:20.

In the above structure, it is characterized in that the third step is performed by using an electrode formed from a metal element that promotes crystallization of the amorphous silicon film and generating plasma.

In the above structure, it is characterized in that, after conducting cleaning in the first step, a coating film constituted of one or a plurality of types of silicon selected from the group consisting of silicon oxide, silicon nitride, silicon oxide nitride, and silicon is deposited on the inside of the film forming chamber. Further, it is characterized in that the coating film has a thickness of 1 μm or more.

In the above structure, it is characterized in that the element that promotes crystallization of the amorphous silicon film is one or a plurality of elements selected from the group consisting of Fe, Ni, Co, Ru, Rh, Pd, Os, Ir, Pt, Cu, and Au.

BRIEF DESCRIPTION OF THE DRAWINGS

In the accompanying drawings:

FIGS. 5A to 5C are cross sectional views of a TFT of Embodiment 1;

FIGS. 6A to 6C are cross sectional views of the TFT of Embodiment 1;

FIGS. 7A and 7B are cross sectional views of the TFT of Embodiment 1;

FIGS. 13A to 13C are cross sectional views of the TFT of Embodiment 3;

FIGS. 14A to 14C are cross sectional views of the TFT of Embodiment 3;

FIGS. 16A and 16B are cross sectional views of the EL display panel of Embodiment 4;

DETAILED DESCRIPTION OF THE PREFERRED EMBODIMENTS

Figure 1:
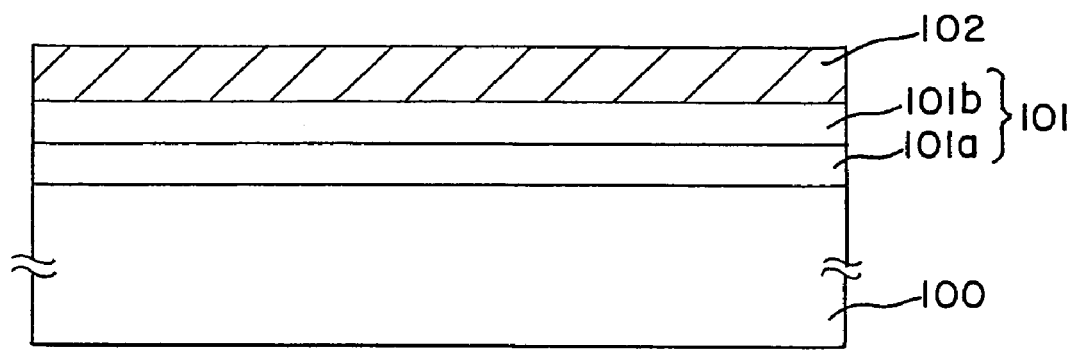
FIG. 1 is a cross sectional view of a TFT of an embodiment mode.
Figure 21:
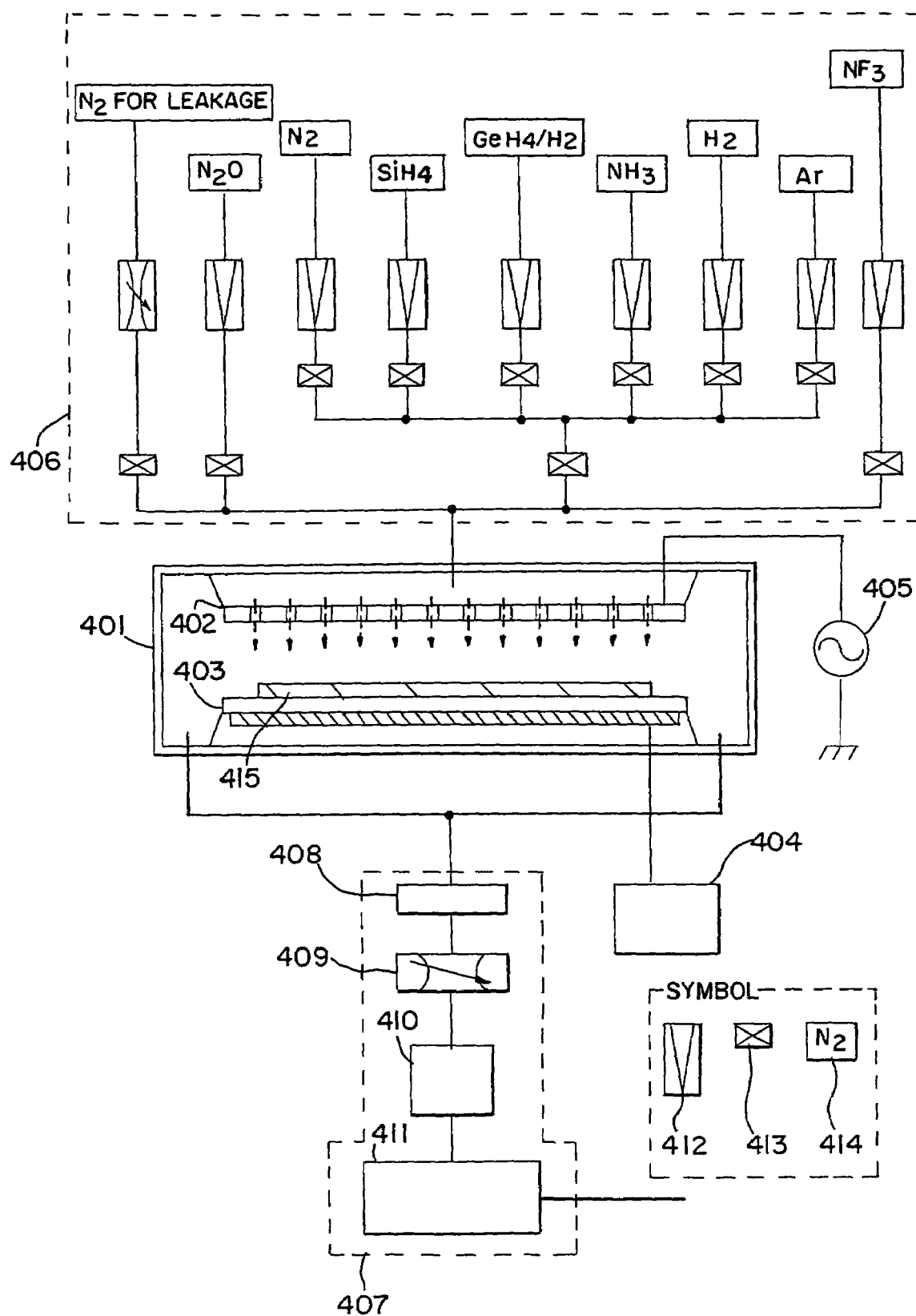
FIG. 21 shows a film forming chamber of a plasma CVD device used in the present invention.

An embodiment mode of the present invention is described below. FIG. 1 shows the embodiment mode of the present invention. A base silicon oxide nitride film (A) 101a, a base silicon oxide nitride film (B) 101b, and an amorphous silicon film 102 are sequentially formed on a substrate 100 of glass, quartz, or the like in a single film forming chamber. FIG. 21 shows a film forming chamber of a plasma CVD device used in the present invention. In a film forming chamber 401, an electrode 402 and a susceptor 403 are provided, and a high frequency power supply 405 and a heater 404 are connected to the electrode and the susceptor, respectively. Further, the film forming chamber 401 is connected with a gas system 406 and an exhaust system 407. The gas system is constituted of gas species 414, mass-flow controllers (MFCs) 412 and valves 413. The exhaust system is constituted of a gate valve 408, an auto-pressure controller (APC) 409, a turbo molecular pump 410, and a dry pump 411. First, a substrate 415 is placed on the susceptor 403, $SiH_4$ gas, $N_2O$ gas, $NH_3$ gas and $H_2$ gas are introduced in the film forming chamber to generate plasma, and the base silicon oxide nitride film (A) 101a is formed with a thickness of 50 nm. After the gas remaining in the film formation chamber is all exhausted, $SiH_4$ gas and $N_2O$ gas are introduced in the film forming chamber to generate plasma, and the base silicon oxide nitride film (B) 101b is formed with a thickness of 50 nm. After the gas remaining in the film forming chamber is all exhausted again, finally, $SiH_4$ gas and $H_2$ gas are introduced in the film forming chamber to generate plasma, and the amorphous silicon film 102 is formed with a thickness of 54 nm. Preferably, the pressure in the film forming chamber at the time of film formation is 13 to 160 Pa, and the substrate temperature is in a range of 300 to 400° C. The used frequency of the high frequency power supply is in a range of 13.56 MHz to 120 MHz.

Figure 2:
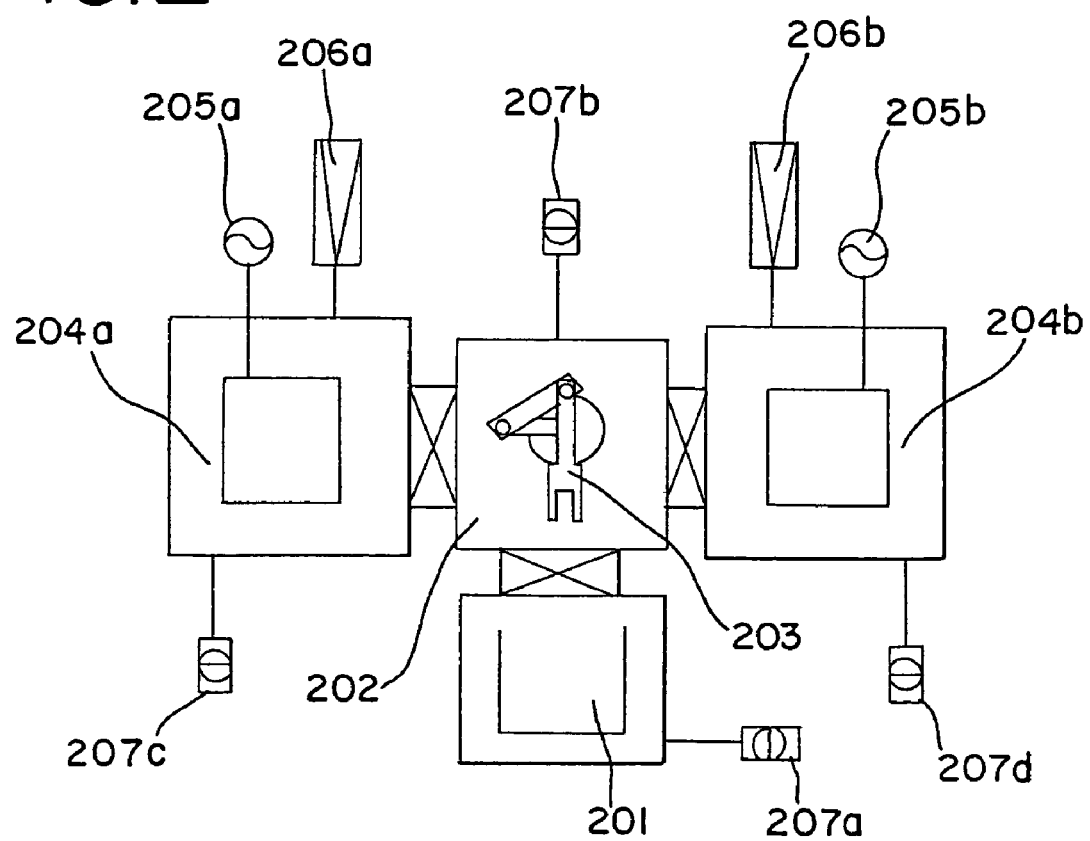
FIG. 2 shows a device of the embodiment mode.
Figure 3A:
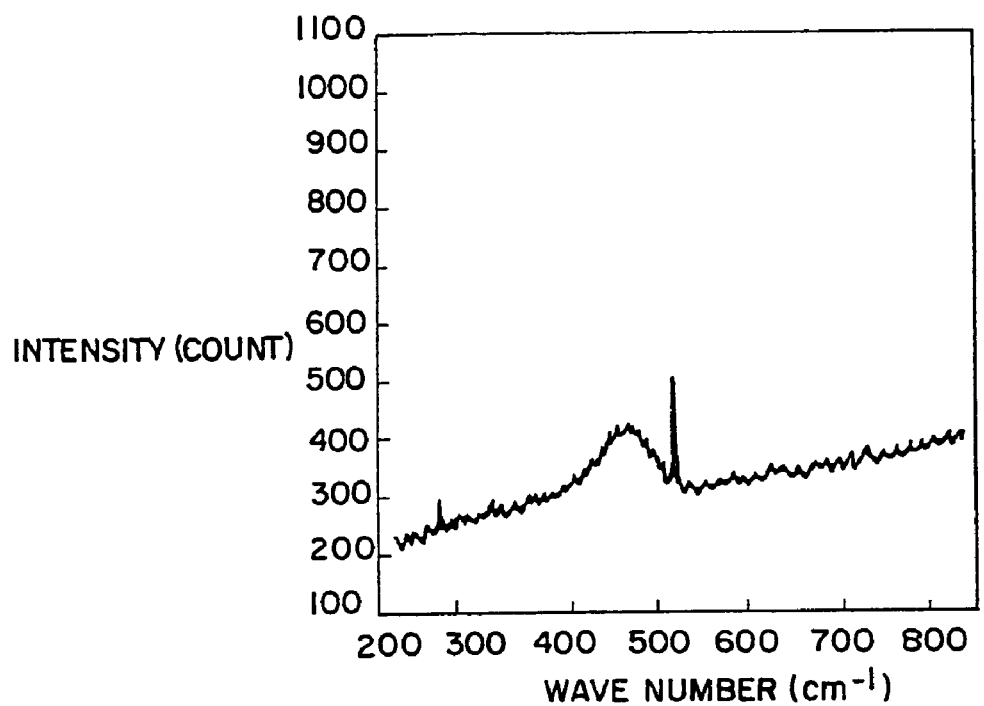
FIGS. 3A and 3B show the results of Raman spectroscopy.
Figure 3B:
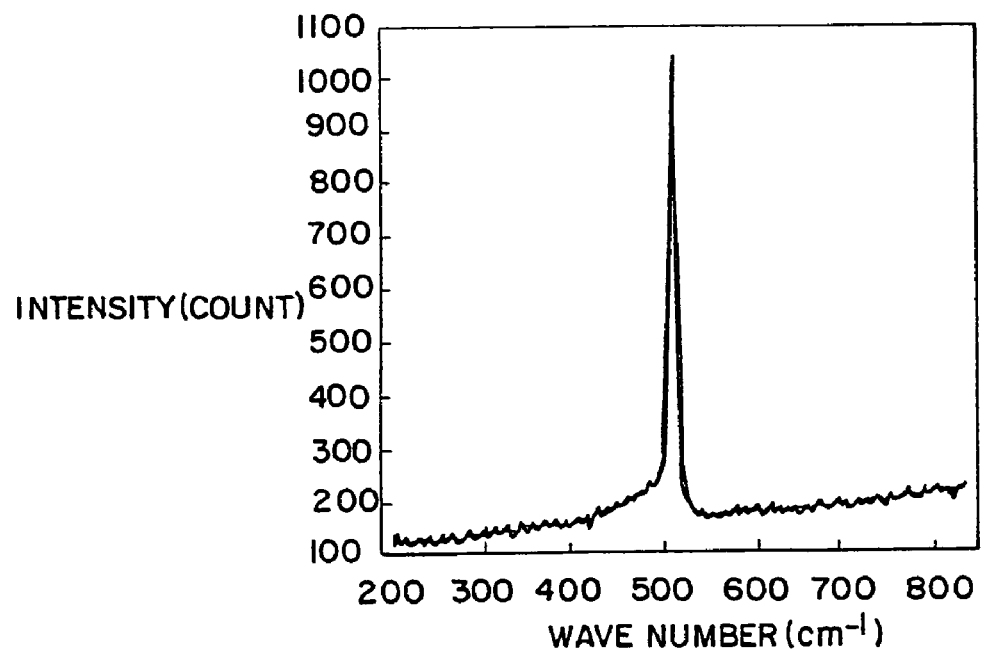
Figure 4B:
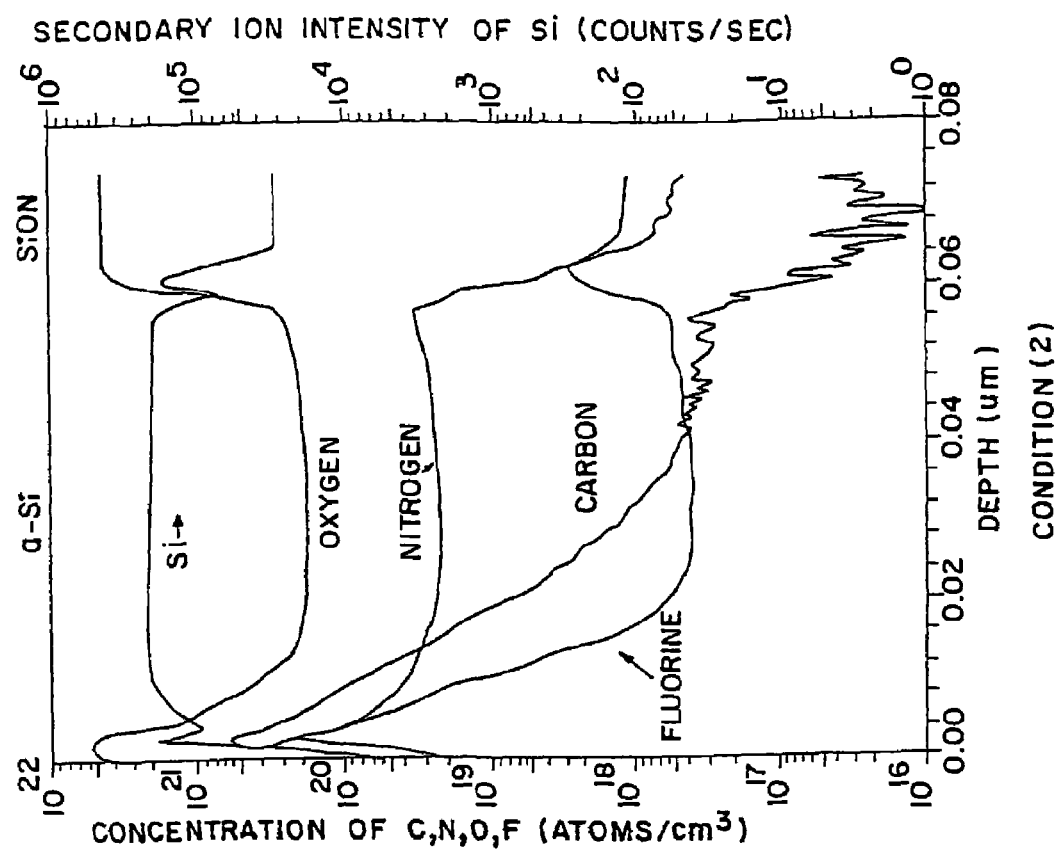
FIGS. 4A and 4B show the results of SIMS spectrometry.
Figure 4A:
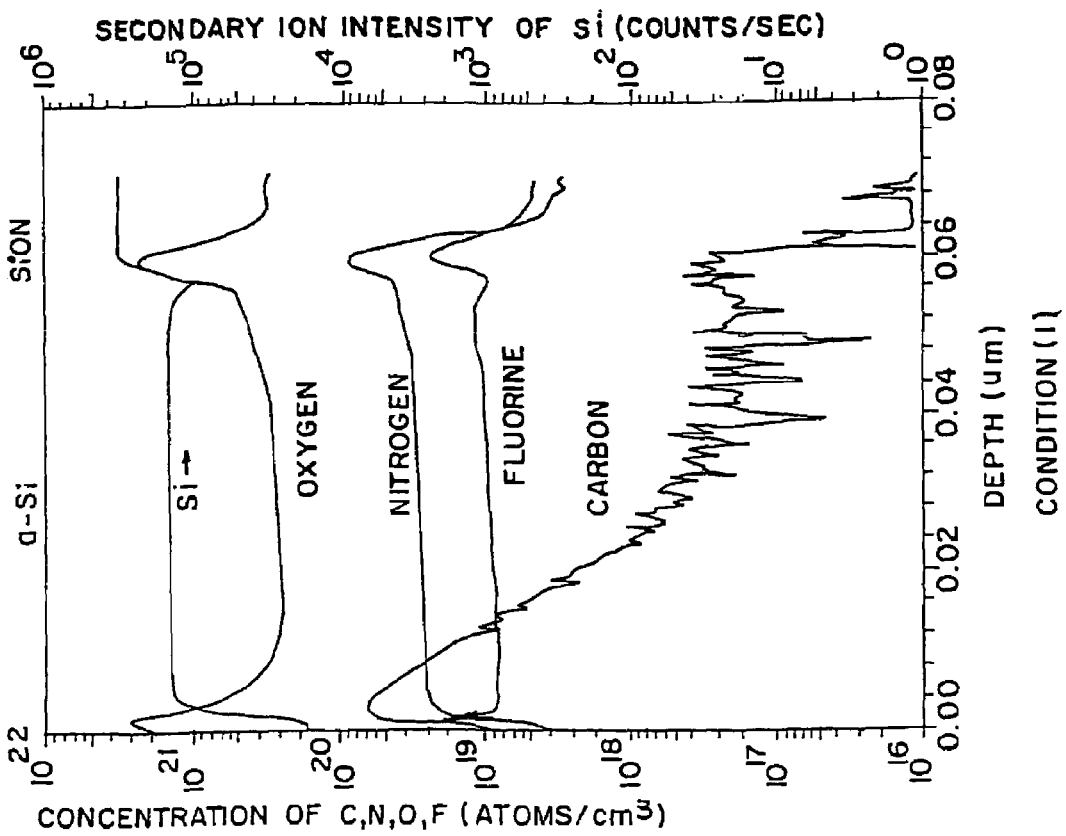

FIG. 2 shows a plasma CVD device suitable for the present invention. Since Ni can be added by a plasma method by using a device having a plurality of film forming chambers shown in FIG. 2, continuous processing is possible from the formation of the base film through the addition of Ni. The plasma CVD device shown here is constituted of a load lock chamber 201, a transfer chamber 202, and film forming chambers 204a and 204b, a substrate set in the load lock chamber 201 is transferred to the respective film forming chambers 204a and 204b by a transfer robot 203 provided in the transfer chamber 202. Plasma generating means 205a, 205b, gas introducing means 206a, 206b, and exhausting means 207c, 207d are respectively provided in the film forming chambers 204a, 204b. In the film forming chamber 204a, continuous formation of the base silicon oxide nitride film through the amorphous silicon film is conducted. Further, an electrode of the film forming chamber 204b is formed from a material containing Ni, plasma is generated by introducing argon gas, nitrogen gas or the like in the film forming chamber 204b, and thus, Ni can be added to the film formed in the film forming chamber 204a. The Ni concentration added here in the surface is desirably $1 \times 10^{10}$ to $1 \times 10^{13}$ atoms/cm². After the addition of Ni, the amorphous silicon film is thermally crystallized at 500 to 600° C. If necessary, laser annealing may be added.

Embodiment 1

Embodiments of the present invention are described with reference to FIGS. 5A to 10. Here, a method of simultaneously manufacturing a pixel portion and TFTs (n-channel TFT and p-channel TFT) for forming a driver circuit provided in the vicinity of the pixel portion on the same substrate is explained in detail.

A glass substrate, a quartz substrate, a ceramic substrate and the like may be used for a substrate 500. Also, a silicon substrate, a metal substrate or a stainless substrate, formed with an insulating film on the surface, may be used. Further, a plastic substrate having heat resistance to a process temperature useable in this embodiment may also be used.

Next, as shown in FIG. 5A, a base film 501 formed of an insulating film such as a silicon oxide film, a silicon nitride film or a silicon oxide nitride film is formed on the substrate 500, and an amorphous semiconductor film 502 is sequentially formed on the base film 501. In this embodiment, a two layer structure is adopted for the base film 501, but a single layer film or a lamination of two or more layers of the above insulating films may be used. A silicon oxide nitride film 501a formed with $SiH_4$, $NH_3$, $N_2O$ and $H_2$ as reaction gases is formed with a thickness of 50 to 100 nm as the first layer of the base film 501. Subsequently, a silicon oxide nitride film 501b formed with $SiH_4$ and $N_2O$ as reaction gases is laminated thereon with a thickness of 100 to 150 nm as the second layer of the base film 501. Further, the amorphous semiconductor film 502 is formed with a thickness of 30 to 60 nm using $SiH_4$ gas and $H_2$ gas. Of course, there is no limitation on the material of the amorphous semiconductor film, and a silicon germanium alloy may also be used.

It is to be noted that, before the film formation, a film forming chamber for continuous formation of the base film 501 and the amorphous semiconductor film 502 is subjected to cleaning with $NF_3$ gas, and thereafter, coating of the silicon oxide nitride film 501a and the silicon oxide nitride film 501b, which constitute the base film, in order is conducted with a thickness of 1 μm or more, preferably 3 μm or more.

Next, the amorphous semiconductor film 502 is added with a catalyst element such as Ni by a plasma method, and thereafter, dehydrogenation for one hour at 500° C. and thermal crystallization for four hours at 550° C. are sequentially performed. Further, laser processing is performed in order to improve crystallization. Thus, a crystalline semiconductor film 503 is formed. Then, a patterning process using a photolithography method is conducted on the crystalline semiconductor film to form island-like semiconductor layers 504 to 508.

Further, the crystalline semiconductor film formed here may be added with an impurity element that imparts p-type in order to control threshold (Vth) of an n-channel TFT. As impurity elements that impart p-type conductivity to the semiconductor, elements belonging to group 13 of the periodic table such as boron (B), aluminum (Al) and Gallium (Ga) are known.

Further, a pulse oscillation type or a continuous emission type excimer laser, a YAG laser, or a YVO$_4$ laser is used in the laser processing. These lasers are used with a method of condensing laser light emitted from a laser oscillator into a linear shape in an optical system, and irradiating the light to a semiconductor film. The crystallization condition may be appropriately selected by an operator.

Subsequently, a gate insulating film 509 that covers the island-like semiconductor layers 504 to 508 is formed. The gate insulating film 509 is formed of an insulating film containing silicon with a thickness of 40 to 150 nm by a plasma CVD method or a sputtering method. Of course, a single layer or a lamination of the insulating film containing silicon may be used as the gate insulating film.

In case of using a silicon oxide film, the film can be formed such that TEOS (tetraethyl orthosilicate) and O$_2$ are mixed by a plasma CVD method with a reaction pressure of 40 Pa and a substrate temperature at 300 to 400° C., and discharged at a high frequency (13.56 MHz) power density of 0.5 to 0.8 W/cm$^2$. The silicon oxide film formed in this way can have satisfactory characteristics as a gate insulating film by a heating process at 400 to 500° C. after the formation.

Next, a first conductive film (TaN) 510 with a film thickness of 20 to 100 nm and a second conductive film (W) 511 with a thickness of 100 to 400 nm are formed in lamination on the gate insulating film 509. The gate conductive films may be formed from an element selected from the group consisting of Ta, W, T, Mo, Al, and Cu, or an alloy material or a compound material containing he element as its main constituent. Further, a semiconductor film typified by a polycrystalline silicon film doped with an impurity element such as phosphorous may be used. The combination of a tantalum (Ta) film as the first conductive film and a W film as the second conductive film, the combination of a tantalum nitride (TaN) film as the first conductive film and an Al film as the second conductive film, and the combination of a tantalum nitride (TaN) film as the first conductive film and a Cu film as the second conductive film may be adopted.

Next, masks 512 to 517 made of resist are formed by using a photolithography method, and a first etching process is performed for forming electrodes and wirings. In this embodiment, an ICP (inductively coupled plasma) etching method is used, a gas mixture of CF$_4$, Cl$_2$ and O$_2$ is used as an etching gas, the gas flow rate is set to 25/25/10 sccm, and a plasma is generated by applying a 500 W RF (13.56 MHz) power to a coil shape electrode at 1 Pa. An RF (13.56 MHz) power of 150 W is also applied to the side of the substrate (sample stage) and a substantially negative self-bias voltage is applied thereto. The W film is etched with this first etching condition to form an end portion of the first conductive layer with a tapered shape.

Thereafter, the first etching condition is switched to the second etching condition while the masks 512 to 517 made of resist are not removed. CF$_4$ and Cl$_2$ are used as an etching gas, the gas flow rate is set to 30/30 sccm, and a plasma is generated by applying a 500 W RF (13.56 MHz) power to a coil shape electrode at 1 Pa to thereby perform etching for about 30 seconds. An RF (13.56 MHz) power of 20 W is also applied to the side of the substrate (sample stage) and a substantially negative self-bias voltage is applied thereto. With the second etching condition in which CF$_4$ and Cl$_2$ are mixed, the W film and the TaN film are etched at almost the same level. Note that the etching time may be increased by approximately 10 to 20% in order to perform etching without any residue on the gate insulating film.

In the first etching process, the masks made of resist are appropriately shaped, and thus, the end portions of the first and second conductive layers are formed to have a tapered shape due to the effect of the bias voltage applied to the substrate side. The angle of the tapered portions may be set to 15 to 45°. Thus, first shape conductive layers 519 to 524 (first conductive layers 519a to 524a and second conductive layers 519b to 524b) constituted of the first conductive layer and the second conductive layer are formed by the first etching process. Reference numeral 518 indicates a gate insulating film, and regions of the gate insulating film not covered by the first shape conductive layers 519 to 524 are made thinner by approximately 20 to 50 nm by etching.

Then, a first doping process is performed to add an impurity element that imparts n-type conductivity without removing the masks made of resist (FIG. 6B). The doping process may be carried out by an ion doping method or an ion injecting method. The condition of the ion doping method is that a dosage is $1\times10^{13}$ to $5\times10^{15}$ atoms/cm$^2$, and an acceleration voltage is 60 to 100 keV. As the impurity element that imparts n-type conductivity, an element belonging to group 15 of the periodic table, typically phosphorus (P) or arsenic (As) is used. In this case, the conductive layers 519 to 524 become masks to the impurity element to impart n-type conductivity, and first impurity regions 527 to 531 are formed in a self-aligning manner. The impurity element to impart n-type conductivity in a concentration range of $1\times10^{20}$ to $1\times10^{21}$ atoms/cm$^3$ is added to the first impurity regions 527 to 531.

Thereafter, as shown in FIG. 6C, a second etching process is performed without removing the masks made of resist. Here, a gas mixture of CF$_4$, Cl$_2$ and O$_2$ is used as etching gas, the gas flow rate is set to 25/25/10 sccm, and a plasma is generated by applying a 500 W RF (13.56 MHz) power to a coil shape electrode at 1 Pa, thereby performing etching. A 20 W RF (13.56 MHz) power is also applied to the substrate side (sample stage), and a lower self-bias voltage compared with the first etching process is applied. With this third etching condition, the W film is etched. Thus, the W film is anisotropically etched with the third condition to form second shape conductive layers 531 to 536.

An etching reaction of the W film or the TaN film by the mixture gas of CF$_4$ and Cl$_2$ can be guessed from a generated radical or ion species and the vapor pressure of a reaction product. When the vapor pressures of fluoride and chloride of W and TaN are compared with each other, the vapor pressure of WF$_6$ which is fluoride of W is extremely high, and other WCl$_5$, TaF$_5$, and TaCl$_5$ have almost equal vapor pressures. Thus, in the mixture gas of CF$_4$ and Cl$_2$, both the W film and the Ta film are etched. However, when a suitable amount of O$_2$ is added to this mixture gas, CF$_4$ and O$_2$ react with each other to form CO and F, and a large number of F radicals or F ions are generated. As a result, an etching speed of the W film having the high vapor pressure of fluoride is increased. On the other hand, with respect to TaN, even if F is increased, an increase of the etching speed is relatively small. Besides, since TaN is easily oxidized as compared with W, the surface of TaN is oxidized a little by addition of O$_2$. Since the oxide of TaN does not react with fluorine or chlorine, the etching speed of the TaN film is further decreased. Accordingly, it becomes possible to make a difference between the etching speeds of the W film and the TaN film, and it becomes possible to make the etching speed of the W film faster than that of the TaN film.

Subsequently, as shown in FIG. 6C, a second doping process is performed without removing the masks made of resist. In this case, a dosage is made lower than that of the first doping process, and under the condition of a high acceleration voltage, an impurity element that imparts n-type conductivity is doped. For example, the process is carried out with an acceleration voltage of 70 to 120 keV, in this embodiment 90 keV, and at a dosage of $3.5 \times 10^{12}$ atoms/cm$^2$, so that new impurity regions are formed into the semiconductor layer inside the first impurity regions formed in FIG. 6B. Doping is carried out such that the second shape conductive layers 531 to 535 are used as masks to the impurity element and the impurity element is added also to the semiconductor layer under second conductive layers 531a to 535a.

In this way, second impurity regions 537 to 541 overlapping the second conductive layers 531a to 535a and the first impurity regions 527 to 531 are formed. The impurity element that imparts n-type conductivity is made to have a concentration of $1 \times 10^{17}$ to $1 \times 10^{19}$ atoms/cm$^3$ in the second impurity regions.

Next, as shown in FIG. 7A, the gate insulating film is etched without removing the masks made of resist. The second conductive layers 531a to 536a are simultaneously etched during etching of the gate insulating film to form third shape conductive layers 542 to 547. Thus, the second impurity regions may be classified into regions 537b to 541b overlapping second conductive layers 542a to 546a and regions 537a to 541a not overlapping the second conductive layers 542a to 546a.

Next, the masks made of resist are removed, and masks 553 to 555 are newly made of resist, and a third doping process is performed as shown in FIG. 7B. By the third doping process, fourth impurity regions 556 to 561 added with the impurity element imparting one conductivity opposite to the conductivity are formed in the semiconductor layer that becomes an active layer of a p-channel TFT. The third shape conductive layers 543 and 546 are used as masks to the impurity element, and the impurity element that imparts p-type conductivity is added, to thereby form the fourth impurity regions in a self-aligning manner. In this embodiment, the impurity regions 556 to 561 are formed by an ion doping method using diborane (B$_2$H$_6$). In the third doping process, the semiconductor layer forming the n-channel TFT is covered with the masks 553 to 555 formed of resist. Although phosphorus is added to the impurity regions 556 to 561 at different concentrations by the first and second doping processes, the doping process is performed such that the concentration of the impurity element imparting p-type conductivity is in a range of $2 \times 10^{20}$ to $2 \times 10^{21}$ atoms/cm$^3$ in any of the impurity regions. Thus, the impurity regions function as the source region and the drain region of the p-channel TFT so that no problem occurs.

In accordance with the above-described processes, the impurity regions are formed in the respective semiconductor layers. The third shape conductive layers 542 to 546 overlapping the semiconductor layer function as gate electrodes. Further, reference numeral 547 indicates a source wiring, and reference numeral 546 indicates a second electrode for forming a storage capacitor.

Subsequently, the masks 553 to 555 consisting of resist are removed, and a first interlayer insulating film 562 covering the whole surface is formed. This first interlayer insulating film 562 is formed of an insulating film containing silicon with a thickness of 100 to 200 nm by a plasma CVD method or a sputtering method. In this embodiment, a silicon oxide nitride film with a film thickness of 150 nm is formed by the plasma CVD method. Of course, the first interlayer insulating film 562 is not particularly limited to the silicon oxide nitride film, and a single layer or a lamination of other insulating films containing silicon may be used.

Figure 8A:
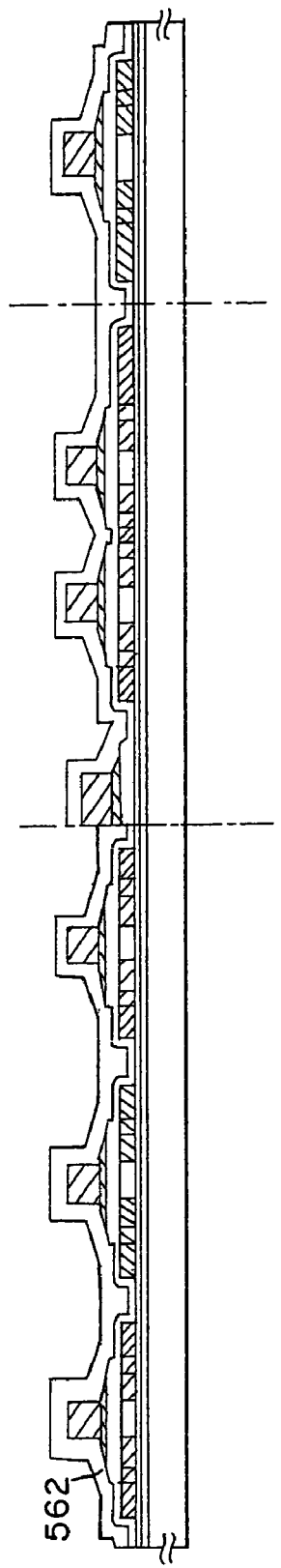
FIGS. 8A and 8B are cross sectional views of the TFT of Embodiment 1.

Then, as shown in FIG. 8A, a process of activating the impurity elements added in the respective semiconductor layers is performed. This activation process is carried out by a heating process using an annealing furnace. The heating process may be performed in a nitrogen atmosphere with oxygen concentration of 1 ppm or less, preferably 0.1 ppm or less and at 400 to 700° C., typically 500 to 550° C. In addition to the heating process, a laser annealing method, or a rapid thermal annealing method (RTA method) can be applied.

Note that, in this embodiment, at the same time with the above activation process, nickel used as the catalyst for crystallization is gettered to the impurity regions 548, 550, 551, 556, and 559 containing phosphorous at high concentration. As a result, nickel concentration of the semiconductor layer that becomes a channel forming region is mainly lowered. The TFT having the channel forming region thus formed is decreased in off current, and has satisfactory crystallinity to obtain high electric field mobility, thereby attaining the satisfactory characteristics.

Further, an activation process may be performed before forming the first interlayer insulating film 562. However, in the case where a wiring material used for the layers 542 to 547 is weak to heat, it is preferable that the activation process is performed after an interlayer insulating film (containing silicon as its main constituent, for example, silicon nitride film) is formed to protect the wiring and the like as in this embodiment.

In addition, a heating process at 300 to 550° C. for 1 to 12 hours is performed in an atmosphere containing hydrogen of 3 to 100% to perform a step of hydrogenating the semiconductor layers. This step is a step of terminating dangling bonds in the semiconductor layer by thermally excited hydrogen. As another means for hydrogenation, plasma hydrogenation (using hydrogen excited by plasma) may be carried out.

Besides, in case of using a laser annealing method as the activation process, it is preferred to irradiate laser light of an excimer laser, a YAG laser or the like after the hydrogenating.

Next, a second interlayer insulating film 563 made from an organic insulating material is formed on the first interlayer insulating film 562. Subsequently, patterning is conducted to form contact holes reaching the source wiring 547 and contact holes reaching the respective impurity regions 548, 550, 551, 556, and 559.

Then, in a driver circuit 706, wirings 564 to 569 electrically connecting to the first impurity regions or the fourth impurity regions, respectively, are formed. Note that these wirings are formed by patterning a lamination film of a Ti film with a film thickness of 50 nm and an alloy film (alloy film of Al and Ti) with a film thickness of 500 nm.

Figure 8B:
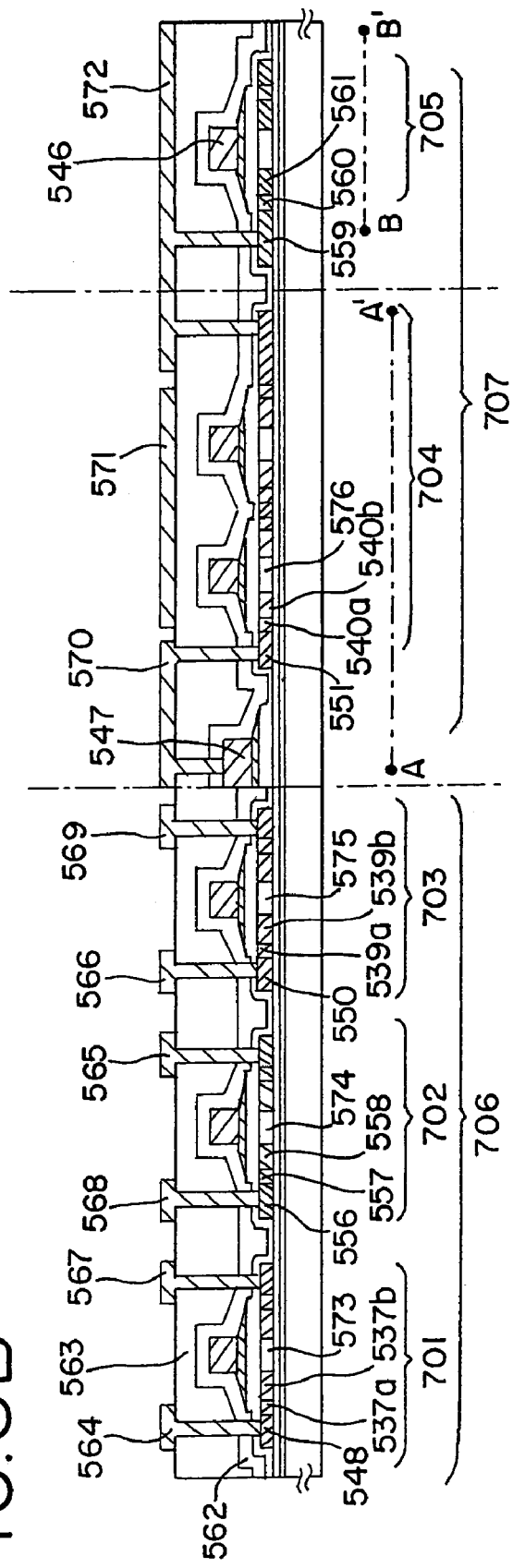

In a pixel portion 707, a pixel electrode 572, a gate conductive film 571, and a connection electrode 570 are formed (FIG. 8B). By this connection electrode 570, the source wiring 547 is electrically connected to a pixel TFT 704. Also, the gate conductive film 571 is electrically connected to the first electrode (third shape conductive layer 545). Besides, the pixel electrode 572 is electrically connected to the drain region of the pixel TFT, and further connected to the semiconductor layer that functions as one of the electrodes forming a storage capacitor. Further, as the pixel electrode 572, a film containing Al or Ag as its main constituent, or a lamination film thereof is preferably used, which has excellent reflection property.

In the manner as described above, the driver circuit 706 including an n-channel TFT 701, a p-channel TFT 702, and an n-channel TFT 703 and the pixel portion 707 including the pixel TFT 704 and a storage capacitor 705 can be formed on the same substrate. In this specification, such a substrate is called an active matrix substrate for convenience.

The n-channel TFT 701 of the driver circuit 706 includes a channel forming region 573, the third impurity region 537b (GOLD region) overlapping the third shape conductive layer 542 forming the gate electrode, the second impurity region 537a (LDD region) formed outside the gate electrode, and the first impurity region 548 functioning as a source region or a drain region. The p-channel TFT 702 includes a channel forming region 574, the fourth impurity region 558 overlapping the third shape conductive layer 543 forming the gate electrode, the fourth impurity region 557 formed outside the gate electrode, and the fourth impurity region 556 functioning as a source region or a drain region. The n-channel TFT 703 includes a channel forming region 575, the third impurity region 539b (GOLD region) overlapping the third shape conductive layer 544 forming the gate electrode, the second impurity region 539a (LDD region) formed outside the gate electrode, and the first impurity region 550 functioning as a source region or a drain region.

The pixel TFT 704 of the pixel portion includes a channel forming region 576, the third impurity region 540b (GOLD region) overlapping the third shape conductive layer 545 forming the gate electrode, the second impurity region 540a (LDD region) formed outside the gate electrode, and the first impurity region 551 functioning as a source region or a drain region. Besides, impurity elements imparting p-type are added to the respective semiconductor layers 559 to 561 functioning as one of electrodes of the storage capacitor 705 at the same concentration as the fourth impurity region. The storage capacitor 705 is constituted of the second electrode 546 and the semiconductor layers 559 to 561 using the insulating film (the same film as the gate insulating film) as a dielectric.

Figure 9:
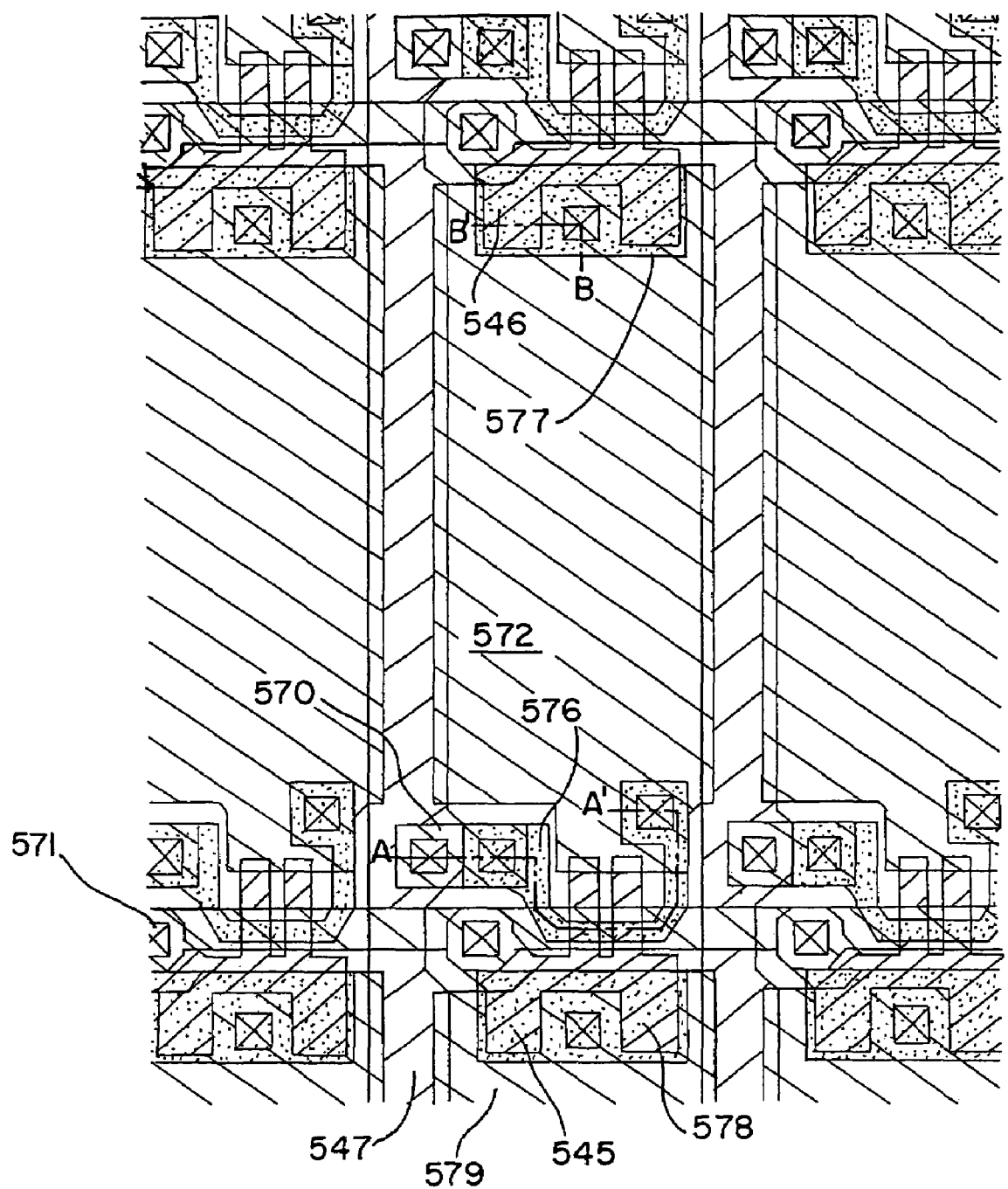
FIG. 9 is a top view of a pixel portion of an active matrix substrate formed in Embodiment 1.

A top view of the pixel portion of the active matrix substrate manufactured in this embodiment is shown in FIG. 9. Note that the same reference symbols are used to indicate corresponding parts among FIGS. 5A to 9. A dash line A–A' in FIG. 9 corresponds to a sectional view taken along the dash line A–A' in FIG. 8B. Also, a dash line B–B' in FIG. 9 corresponds to a sectional view taken along the dash line B–B' in FIG. 8B.

As described above, the active matrix substrate having a pixel structure according to this embodiment has a feature that the first electrode 545, a part of which functions as the gate electrode, and the gate conductive film 571 are formed on the different layers so the semiconductor layers are shielded from light by the gate conductive film 571.

Further, in the pixel structure of this embodiment, an end portion of the pixel electrode is formed and arranged so as to overlap the source wiring so that the gap between the pixel electrodes is shielded from light without using a black matrix.

Besides, the surface of the pixel electrode of this embodiment is made uneven by means of a known method such as a sandblasting method or an etching method, and thus, it is preferable that a white degree is increased by scattering reflection light while preventing mirror reflection.

By taking the above-mentioned pixel structure, a pixel electrode having a larger area may be arranged, thereby being capable of increasing an aperture ratio.

In addition, in accordance with the steps of this embodiment, the number of photo masks needed for the manufacture of the active matrix substrate may be set to five pieces (a semiconductor layer patterning mask, a first wiring patterning mask (including the first electrode 545, the second electrode 546, and the source wiring 547), a patterning mask for forming a source region and a drain region of a p-type TFT, a patterning mask for forming contact holes, and a second wiring patterning mask (including the pixel electrode 572, the connection electrode 570, and the gate conductive film 571)). As a result, this can contribute to shortening of the manufacturing steps, a reduction in the manufacturing cost, and an improvement of the yield.

Figure 10:
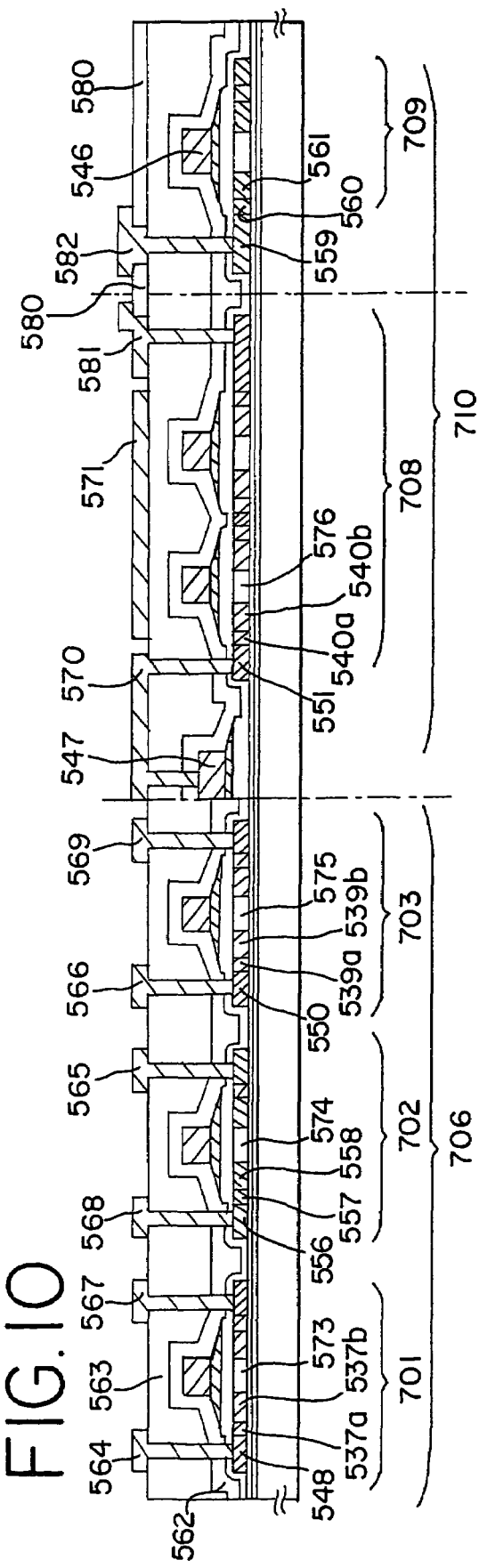
FIG. 10 is a cross sectional view of the TFT in Embodiment 1.

FIG. 10 is a cross sectional view of an active matrix substrate suitable for a transmission type liquid crystal display device. The manufacturing steps through the formation of the second interlayer film are the same as the reflection type liquid crystal display device. A transparent conductive film is formed on the second interlayer film of a pixel portion 710. Then, patterning is performed for forming a transparent conductive film layer 580. A compound of indium oxide and tin oxide or a compound of indium oxide and zinc oxide may be used for the transparent conductive film.

Then, in the driver circuit 706, the wirings 564 to 569 electrically connecting to the first impurity regions or the fourth impurity regions, respectively, are formed. Note that these wirings are formed by patterning a lamination film of a Ti film with a film thickness of 50 nm and an alloy film (alloy film of Al and Ti) with a film thickness of 500 nm. Further, in the pixel portion 710, pixel electrodes 581, 582, the gate conductive film 571, and the connection electrode 570 are formed. In this way, the pixel portion 710 constituted of a pixel TFT 708 and a storage capacitor 709 is formed. As described above, by increasing the number of masks by one, the active matrix substrate suitable for the transmission type liquid crystal display device may be manufactured.

Embodiment 2

Figure 11:
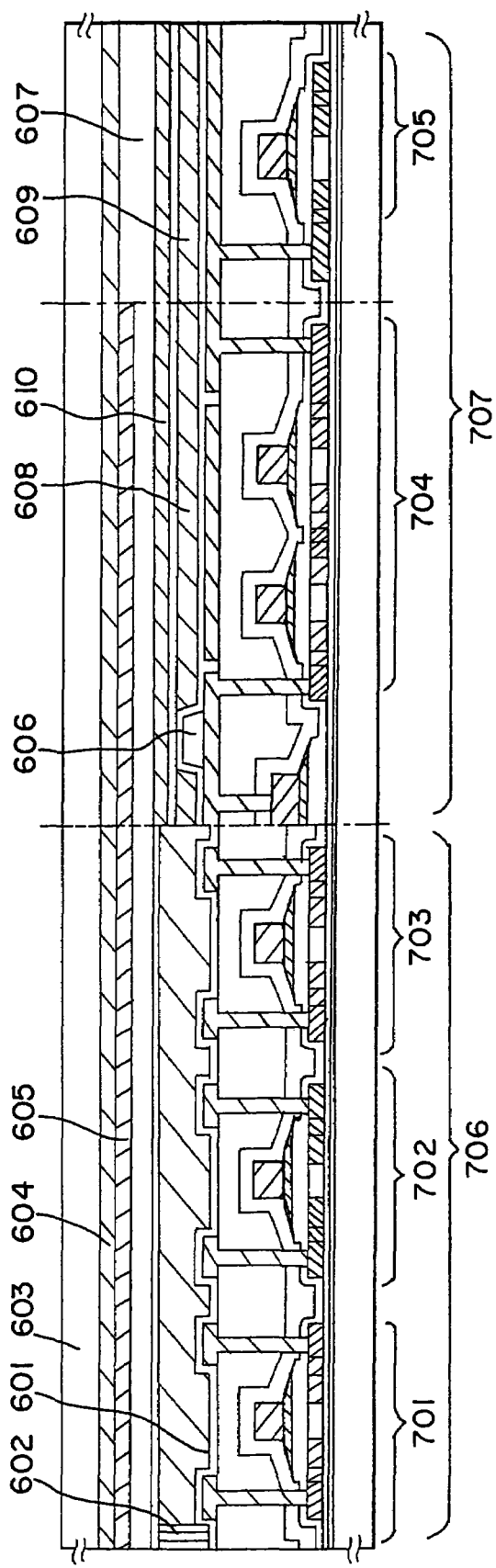
FIG. 11 is a cross sectional view of an active matrix liquid crystal display device of Embodiment 2.

In this embodiment, a process of manufacturing an active matrix liquid crystal display device from the active matrix substrate manufactured in Embodiment 1 is described below. FIG. 11 is used for the explanation.

First, in accordance with Embodiment 1, after the active matrix substrate in the state of FIG. 8B is manufactured, an orientation film 601 is formed on the active matrix substrate of FIG. 8B, and a rubbing process is performed. Note that, in this embodiment, a columnar spacer 606 for maintaining an interval between substrates is formed at a desired position by patterning an organic resin film such as an acrylic resin film before the formation of the orientation film 601. Further, spherical spacers may be scattered onto the entire surface of the substrate instead of the columnar spacer.

Next, colored layers 604, 605 and a levelling film 607 are formed on an opposing substrate 603. The red-colored layer 604 and the blue-colored layer 605 are partially overlapped with each other to form a second light shielding portion. Note that, although not shown in FIG. 11, the red-colored layer and a green-colored layer are partially overlapped with each other to form a first light shielding portion.

Thereafter, an opposing electrode 610 is formed in a pixel portion, an orientation film 608 is formed on the entire surface of the opposing substrate, and a rubbing process is conducted thereon.

Then, the active matrix substrate on which the pixel portion and a driver circuit are formed is stuck with the opposing substrate by a sealing agent 602. In the sealing agent 602, filler is mixed, and the two substrates are stuck with each other while keeping a uniform gap by the effect of this filler and the columnar spacer 606. Thereafter, a liquid crystal material is injected between both the substrates to completely encapsulate the substrates by an encapsulant (not shown). A known liquid crystal material may be used as the liquid crystal material. Thus, the active matrix liquid crystal display device shown in FIG. 11 is completed.

In this embodiment, the substrate shown in Embodiment 1 is used. Accordingly, in FIG. 9 showing a top view of the pixel portion in accordance with Embodiment 1, light shielding must be performed at at least the gaps between the gate wiring 571 and the pixel electrodes 572, 579, a gap between the gate wiring 571 and the connection electrode 570, and a gap between the connection electrode 570 and the pixel electrode 572. In this embodiment, the opposing substrate is stuck to the active matrix substrate so that the first light shielding portion and the second light shielding portion overlap the positions which need to be shielded from light.

Embodiment 3

In this embodiment, a method of simultaneously manufacturing a pixel portion and TFTs (n-channel TFT and p-channel TFT) for forming a driver circuit in the vicinity of the pixel portion is explained with reference to FIGS. 12A to 14C.

Figure 12A:
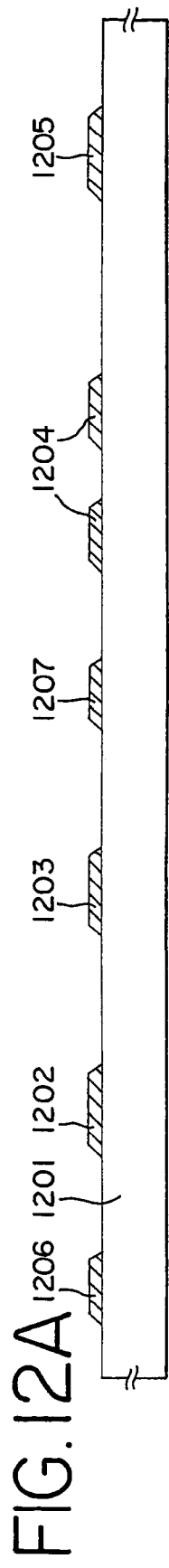
FIGS. 12A to 12D are cross sectional views of a TFT of Embodiment 3.

First, as shown in FIG. 12A, on a substrate 1201 made of glass such as barium borosilicate glass or alumino borosilicate glass, typified by #7059 glass or #1737 glass of Corning Inc., preferably, gate electrodes 1202 to 1204, source wirings 1206, 1207 and a capacitor wiring 1205 for forming a storage capacitor of the pixel portion are formed from a conductive film containing one or a plurality of elements selected from the group consisting of molybdenum (Mo), tungsten (W) and tantalum (Ta). For example, an alloy of Mo and W is suitable from the viewpoint of low resistance and heat resistance. Further, the surface of the substrate may be oxidized using aluminum to form the gate electrode.

The gate electrode manufactured by a first photomask is formed with a thickness of 200 to 400 nm, preferably 250 nm, and the end portion is formed into a tapered shape in order to improve a coating property (step coverage) of a coating film formed on the upper layer. The angle of the tapered portion is 5 to 30°, preferably 15 to 25°. The tapered portion is formed by a dry etching method, and the angle is controlled by etching gas and a bias voltage applied to the substrate side.

Figure 12B:
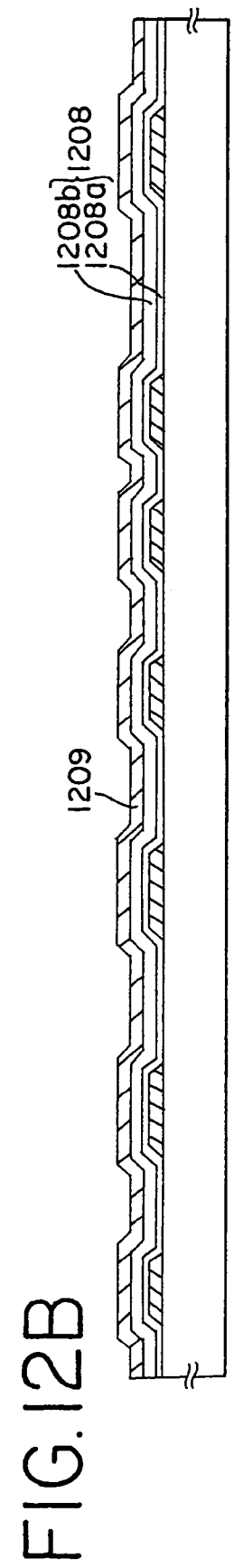

Next, as shown in FIG. 12B, a first insulating layer 1208 for covering the gate electrodes 1202 to 1204, the source wirings 1206, 1207 and the capacitor wiring 1205 for forming a storage capacitor of the pixel portion, and an amorphous semiconductor film 1209 on the first insulating layer 1208 are formed in succession. In this embodiment, a two-layer structure is adopted for the first insulating layer 1208, but a single layer film or a lamination of two layers or more of a silicon oxide film, a silicon nitride film or a silicon oxide nitride film may be used. As the first layer of the first insulating layer 1208, a silicon oxide nitride film 1208a having a thickness of 50 to 100 nm is formed with reaction gases of $SiH_4$, $NH_3$, $N_2O$ and $H_2$. Next, as the second layer of the first insulating layer 1208, a silicon oxide nitride film 1208b having a thickness of 100 to 150 nm is laminated thereon with reaction gases of $SiH_4$ and $N_2O$.

Further, the amorphous semiconductor film 1209 is formed with a thickness of 30 to 60 nm. There is no limitation on the material of the amorphous semiconductor film, but the film is preferably formed from silicon, a silicon germanium alloy or the like. In this embodiment, the amorphous silicon film 1209 is formed using $SiH_4$ gas and $H_2$ gas.

It is to be noted that, in a film forming chamber for continuous formation of a base film 501 and an amorphous silicon film 502, cleaning is performed with $NF_3$ gas before the film formation, and thereafter, coating is performed with the order of a silicon oxide nitride film 501a, a silicon oxide nitride film 501b, which constitute a base film, and an amorphous silicon film, with a thickness of 1 µm or more, preferably 3 µm or more.

The first insulating layer 1208 formed with a semiconductor layer on the upper layer is used as a gate insulating film, and also, has a function as a blocking layer that prevents impurities such as alkali metal from being diffused into the semiconductor layer from the substrate 1201.

Subsequently, the formed amorphous semiconductor film is crystallized by a known crystallization technique. With regard to a method of obtaining a crystalline semiconductor film, Embodiment 1 may be referred to.

Figure 12C:
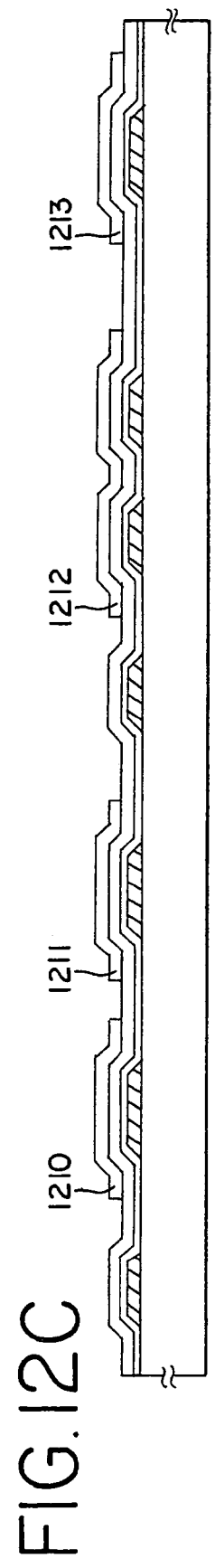

The obtained crystalline semiconductor film is formed into a predetermined pattern using a second photomask. FIG. 12C shows island-shape semiconductor layers 1210 to 1213. The semiconductor layers 1210 and 1212 are formed so as to partially overlap the gate electrodes 1202 and 1204.

Figure 12D:
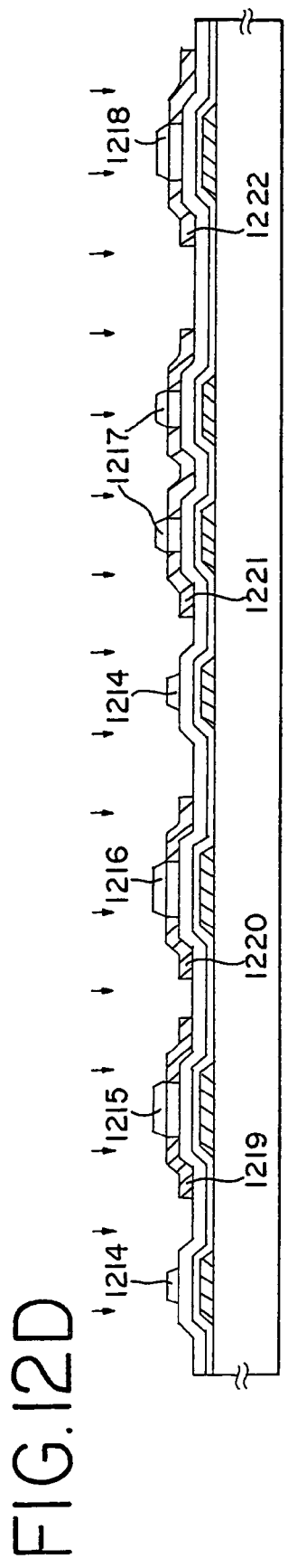

Thereafter, an insulating film made of silicon oxide or silicon nitride having a thickness of 100 to 200 nm is formed on the island-like semiconductor layers 1210 to 1213. In FIG. 12D, on the island-like semiconductor layers 1210 to 1213 are formed with third insulating layers 1214 to 1218 which become channel protective films in a self-aligning manner by an exposure process from the back surface using the gate electrodes as masks.

Then, a first doping process is conducted in order to form an LDD region of an n-channel TFT. The doping may be conducted by an ion doping method or an ion injecting method. Phosphorous (P) is added as n-type impurities (donor) to form first impurity regions 1219 to 1222 using the third insulating layers 1215 to 1218 as masks. The donor concentration in these regions is $1 \times 10^{16}$ to $2 \times 10^{17}$ atoms/$cm^3$.

A second doping process is a process of forming a source region and a drain region of the n-channel TFT. As shown in FIG. 13A, masks 1223 to 1225 are formed from resist by using a third photomask. The masks 1224 and 1225 are formed covering the LDD regions of the n-channel TFTs, and donor impurities are added to second impurity regions 1226 to 1228 in a concentration range of $1 \times 10^{20}$ to $1 \times 10^{21}$ atoms/$cm^3$.

Before or after the second doping process, it is preferable that an etching process is conducted with hydrofluoric acid in the state that the masks 1223 to 1225 have been formed, and the third insulating layers 1214 and 1218 are removed.

As shown in FIG. 13B, a third doping process is conducted in a source region and a drain region of a p-channel TFT to form third impurity regions 1230 and 1231 by adding p-type impurities (acceptor) with an ion doping method or an ion injecting method. The p-type impurity concentration in these regions is set to $2\times10^{20}$ to $2\times10^{21}$ atoms/cm$^3$. In this process, p-type impurities are also added to the semiconductor layer 1213.

Subsequently, as shown in FIG. 13C, a second insulating layer is formed on the semiconductor layer. Preferably, the second insulating layer is constituted of a plurality of insulating films. A first layer 1232 of the second insulating layer formed on the semiconductor layer is formed from inorganic insulator made of a silicon nitride film or a silicon oxide nitride film containing hydrogen with a thickness of 50 to 200 nm. Thereafter, a process of activating the impurities added to the respective semiconductor layers is performed. This activation process is carried out by a heating process using an annealing furnace. A laser annealing method or a rapid thermal annealing method (RTA method) may also be applied. In case of performing the heating process, the process is performed in a nitrogen atmosphere at 400 to 600° C., typically 450 to 500° C. for 1 to 4 hours.

By this heating process, hydrogen of the silicon nitride film or the silicon oxide nitride film of the first layer 1232 of the second insulating layer is emitted together with the activation of the impurity elements, and hydrogenation of the semiconductor layer can be carried out. This process is a process of terminating dangling bonds of the semiconductor layer by hydrogen. As a means for further efficiently performing hydrogenation, plasma hydrogenation (using hydrogen excited by plasma) may be conducted before the formation of the first layer 1232 of the second insulating layer.

A second layer 1233 of the second insulating layer shown in FIG. 14A is formed from an organic insulator material such as polyimide or acrylic resin, and the surface is flattened. Of course, a silicon oxide film formed by using TEOS (tetraethyl orthosilicate) with a plasma CVD method may be applied. However, the organic insulator material is desirably used from the viewpoint of increasing flatness.

Subsequently, contact holes are formed using a fifth photomask. Then, a connection electrode 1234 and source or drain wirings 1235 to 1237 are formed in a driver circuit 1305 using aluminum (Al), titanium (Ti), tantalum (Ta) and the like with a sixth photomask. Further, in a pixel portion 1306, a pixel electrode 1240, a gate wiring 1239 and a connection electrode 1238 are formed.

In this way, the driver circuit 1305 having a p-channel TFT 1301 and an n-channel TFT 1302 and the pixel portion 1306 having a pixel TFT 1303 and a storage capacitor 1304 are formed on the same substrate. A channel forming region 1307 and a source or drain region 1308 comprised of the third impurity region are formed in the p-channel TFT 1301 of the driver circuit 1305. A channel forming region 1309, an LDD region 1310 comprised of the first impurity region, and a source or a drain region 1311 comprised of the second impurity region are formed in the n-channel TFT 1302. The pixel TFT 1303 of the pixel portion 1306 has a multi-gate structure and is formed with a channel forming region 1312, an LDD region 1313, source or drain regions 1314 and 1316. A second impurity region 1315 provided between the LDD regions is useful for reducing off current. The storage capacitor 1304 is constituted of the capacitor wiring 1205, the semiconductor layer 1213, and the first insulating layer formed therebetween.

In the pixel portion 1306, the source wiring 1207 is electrically connected with the source or drain region 1314 of the pixel TFT 1303 by the connection electrode 1238. Further, the gate wiring 1239 is electrically connected with the first electrode. The pixel electrode 1240 is connected with the source or drain region 1316 of the pixel TFT 1303 and the semiconductor layer 1213 of the storage capacitor 1304.

FIG. 14B is a diagram explaining a contact portion of the gate electrode 1204 and the gate wiring 1239. The gate electrode 1204 also serves as one electrode of the storage capacitor of the adjacent pixels, and constitutes a capacitor at the portion overlapping the semiconductor layer 1244 connected with the pixel electrode 1245. Further, FIG. 14C shows the positional relationship between the source wiring 1207 and the pixel electrode 1240 and its adjacent pixel electrode 1246. The end portion of the pixel electrode is provided above the source wiring 1207 to form the overlapping portion, and thus, stray light is blocked to increase the light shielding property. Note that the above substrate is referred to as an active matrix substrate for convenience in this specification.

One of the advantages of forming an inverse stagger type TFT is that the LDD region overlapping a gate electrode in an n-channel TFT can be formed in a self-aligning manner by a back surface exposure process. Thus, with the feature that a gate insulating film and a semiconductor layer can be formed in succession, variation of characteristics of the TFT can be suppressed.

The pixel structure shown in FIG. 14C is suitable for a reflection type liquid crystal display device. Further, by using a transparent conductive film as in Embodiment 1, a transmission type liquid crystal display device with the pixel structure may also be manufactured.

Embodiment 4

Figure 15A:
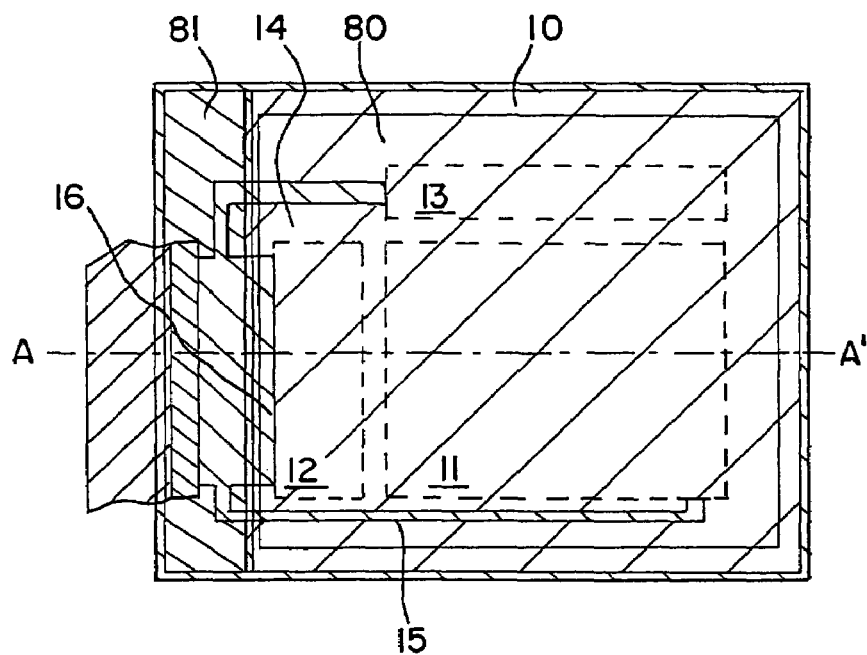
FIGS. 15A and 15B a top view and a cross sectional view of an EL display panel of Embodiment 4.

In Embodiment 4, as an example of an EL display device using an active matrix substrate which is formed in the Embodiments 1 and 3. FIG. 15A is a top view of the EL display panel in accordance with the present invention. In FIG. 15A, reference numeral 10 denotes a substrate; 11, a pixel portion; 12, a source side driver circuit; and 13, a gate side driver circuit, and the respective driver circuits reach an FPC 17 through wirings 14 to 16 to be connected to external equipment.

Figure 15B:
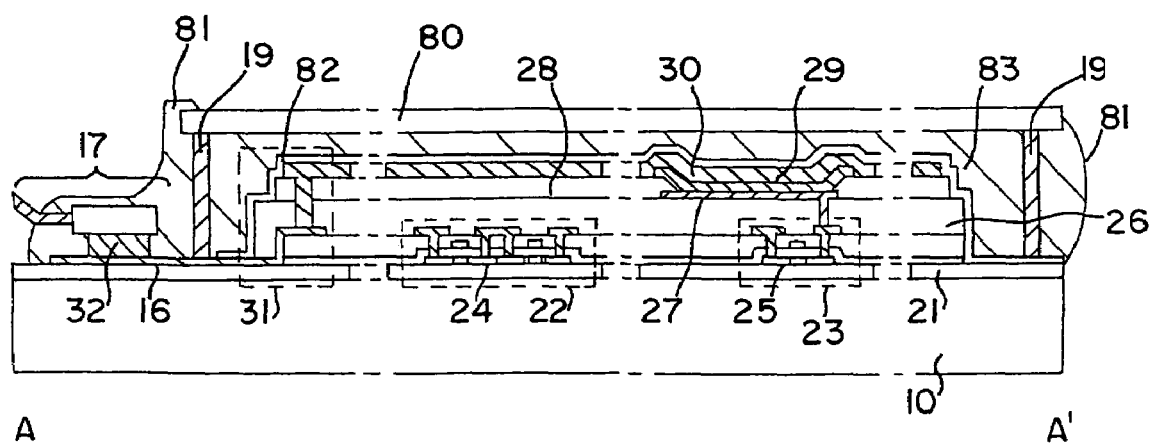

FIG. 15B is a cross sectional view taken along the line of A–A$_0$ of FIG. 15A. In this case, an opposing plate 80 is provided at least over the pixel portion, preferably both over the driver circuit and the pixel portion. The opposing plate 80 is bonded together by a sealing agent 19 with the active matrix substrate on which TFTs and the self-emitting layer using EL materials are formed. In the sealing agent 19, filler (not shown) is mixed. As a result, two substrates are bonded together with a substantially uniform gap therebetween by the merit of the filler. In addition, a structure is taken, in which an outside of the sealing agent 19 and the top and periphery of the FPC 17 are air-tightly sealed by an sealant 81. The sealant 81 may uses the material such as a silicon resin, an epoxy resin, phenol resin, or butyl rubber.

Like this, if the active matrix substrate 10 and the opposing substrate 80 are bonded together by the sealing agent 19, the gap is formed therebetween. In the gap, a filler 83 is charged thereinto. The filler 83 also has an effect to bond the opposing substrate 80. The filler 83 may use PVC (polyvinyl chloride), the epoxy resin, the silicon resin, EVA (ethylene vinyl acetate), or the like. Besides, the self-emitting layer is weak in moisture such as water, thereby easily degrading. Therefore, if a drying agent such as barium oxide is mixed in the filler 83, a moisture-absorption effect can be retained, which is preferable. Further, a structure is taken, in which a passivation film 82 formed from a silicon nitride film or a silicon oxynitride film is formed on the self-emitting layer, to thereby protect corrosion caused by an alkaline element contained in the filler 83. Also, in FIG. 15B, on the base film 21 on the substrate 10, a driver circuit TFT 22 (It is to be noted that a CMOS circuit is illustrated here, in which an n-channel TFT and a p-channel TFT are combined.) and a pixel TFT 23 (It is to be noted that only a TFT for controlling a current flown into the EL element is illustrated here.) are formed.

In order to fabricate the EL display device from the active matrix substrate, which is formed in Embodiments 1 to 3, an interlayer insulating film (flattening film) 26 comprising a resin material is formed above a source line and a drain line and a pixel electrode 27 comprising a transparent conductive film electrically connected to the drain of TFT 23 for the pixel portion is formed thereabove. There can be used a compound of indium oxide and tin oxide (referred to as ITO) or a compound of indium oxide and zinc oxide for the transparent conductive film. Further, when the pixel electrode 27 is formed, an insulating film 28 is formed and an opening portion is formed above the pixel electrode 27.

Next, a self-emitting layer 29 is formed. As the self-emitting layer 29, a laminate layer structure by freely combining well-known EL materials (hole injecting layer, hole transporting layer, light emitting layer, electron transporting layer, and electron injecting layer), or a single layer structure may be adopted. A well-known technique may be used to determine the structure. The EL material includes a low molecular weight material and a high molecular (polymer) material. In the case where the low molecular weight material is used, an evaporation method is used. In the case where the high molecular material is used, it is possible to use a simple method such as a spin coating method, a printing method or an ink jet method.

The self-emitting layer is formed by an evaporation method, an ink-jet method or a dispenser method using a shadow mask. Whichever method is used, color display becomes possible by forming light-emitting layers (red light-emitting layer, green light-emitting layer, and blue light-emitting layer), each of which can emit light with a different wave length for each pixel. In addition, there are a system in which a color conversion layer (CCM) and a color filter are combined, and a system in which a white light-emitting layer and a color filter are combined, and either system may be used. Of course, an EL display device which emits monochromatic light may be used.

After the self-emitting layer 29 is formed, a cathode 30 is formed thereon. It is desirable to remove moisture and oxygen existing in the interface between the cathode 30 and the self-emitting layer 29 to the utmost. Thus, it is necessary to make such contrivance that the self-emitting layer 29 and the cathode 30 are continuously formed in vacuum, or the self-emitting layer 29 is formed in an inert gas atmosphere and the cathode 30 is formed without releasing to the atmosphere. In Embodiment 4, a film formation apparatus of a multi-chamber system (cluster tool system) is used, so that the foregoing film formation is made possible.

The cathode 30 is connected to the wiring 16 in a region designated by reference numeral 31. The wiring 16 is a power supply line for giving a predetermined voltage to the cathode 30, and is connected to the FPC 17 through an anisotropic conductive paste material 32. A resin layer 81 is formed on the FPC 17 to enhance the adhesion of this portion.

For the purpose of electrically connecting the cathode 30 to the wiring 16 in the region denoted by reference numeral 31, it is necessary to form contact holes in the interlayer insulating film 26 and the insulating film 28. These may be formed at the time of etching the interlayer insulating film 26 (at the time of forming the contact hole for the pixel electrode) and at the time of etching the insulating film 28 (at the time of forming the opening portion before formation of the self-emitting layer). When the insulating film 28 is etched, the interlayer insulating film 26 may be etched together. In this case, if the interlayer insulating film 26 and the insulating film 28 are made of the same resin material, the shape of the contact hole can be made excellent.

Besides, a wiring line 16 is electrically connected to an FPC 17 through a gap (which is filled in with a sealing agent 81) between the sealing agent 19 and a substrate 10. Note that although description is made of the wiring 16 here, other wirings 14 and 15 are also electrically connected to the FPC 17 under the sealing agent 18 in the same manner.

Figure 17:
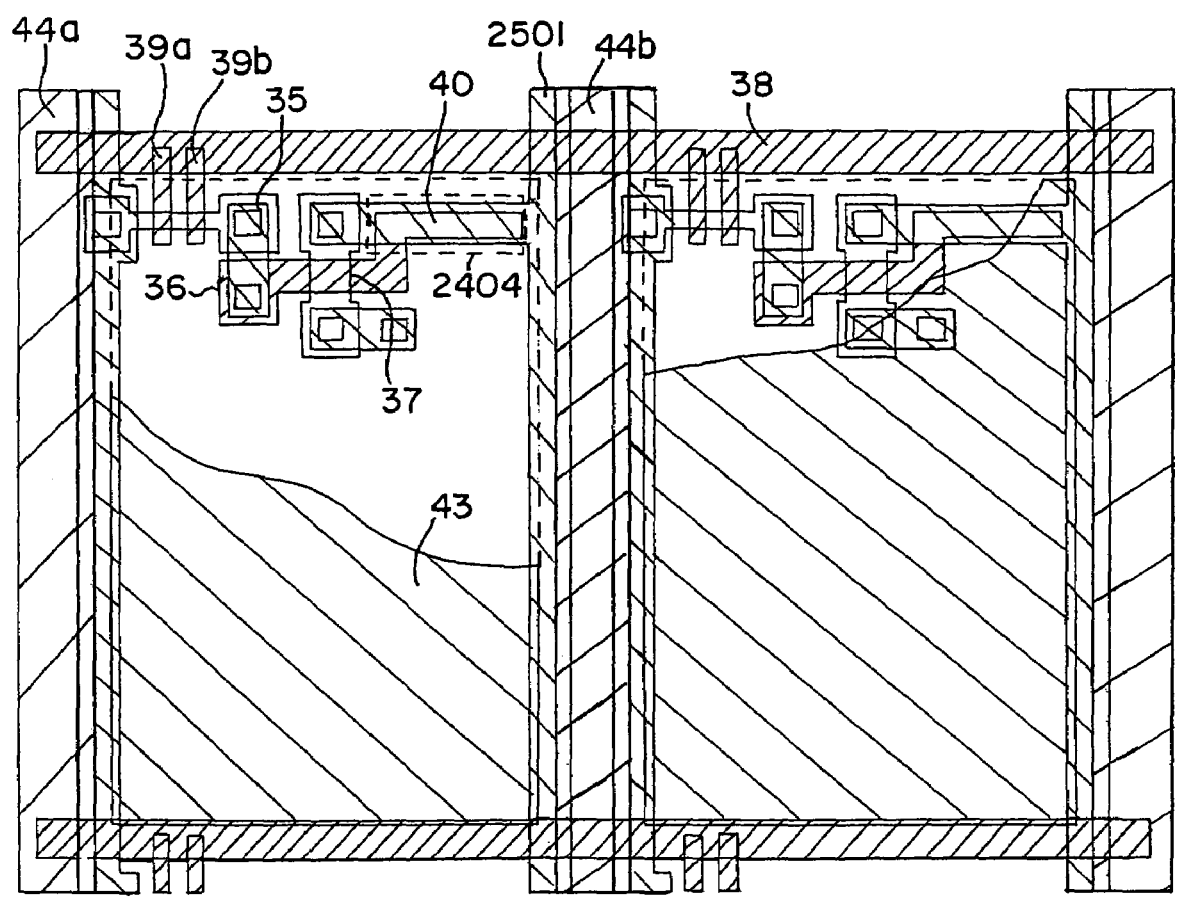
FIG. 17 is a top view of the EL display panel of Embodiment 4.

Here, a more detailed sectional structure of a pixel portion is shown in FIG. 16A or 16B, its upper structure is shown in FIG. 17. In FIG. 16A, a switching TFT 2402 formed on a substrate 2401 has the same structure as the pixel TFT 704 of Embodiment 1 shown in FIG. 8B. Note that, although the double gate structure is adopted in Embodiment 4, a triple gate structure or a multi-gate structure having more gates may be adopted.

Further, the current controlling TFT 2403 has a structure in which an LDD overlapping with a gate electrode is provided at only drain side, and the structure has an ability of driving a current by reducing a parasitic capacitance and series resistance between a gate and drain. Further, since the current controlling TFT is an element for controlling the amount of a current flowing through an EL element, the current controlling TFT is likely to be degraded by heat and hot carriers due to a large amount of current flowed therethrough. Therefore, an LDD region overlapping partly with a gate electrode, is provided on the current controlling TFT, thereby preventing the deterioration of TFT and enhancing the stability of the operation. At this time, a drain wiring 35 of the switching TFT 2402 is electrically connected to the gate electrode 37 of the current controlling TFT through the wiring 36. Further, the wiring denoted by a reference numeral 38 is a gate wiring for connecting the gate electrodes 39a and 39b of the switching TFT 2402.

Also, in Embodiment 4, although the current controlling TFT 2403 is shown as a single gate structure, a multi-gate structure in which a plurality of TFTs are connected in series with each other may be adopted. In addition, such a structure may be adopted that a plurality of TFTs are connected in parallel with each other to essentially divide a channel forming region into plural portions, so that radiation of heat can be made at high efficiency. Such structure is effective as a countermeasure against deterioration due to heat.

Further, as shown in FIG. 17, the wiring which becomes the gate electrode 37 of the current controlling TFT 2403 overlaps with a drain wiring 40 of the current controlling TFT 2403 through an insulating film in a region designated by 2404. At this time, a capacitor is formed in the region 2404. This capacitor 2404 functions as a capacitor for holding voltage applied to the gate of the current controlling TFT 2403. Note that, the drain wiring 40 is connected to a current supply line (power source line) 2501 and a constant voltage is always applied thereto.

A first passivation film 41 is provided on the switching TFT 2402 and the current controlling TFT 2403, and a leveling film 42 made of a resin insulating film is formed on top. It is very important to level a step portion due to the TFT using the leveling film 42. Since an self-emitting layer formed later is very thin, there is a case of occurring poor light emission due to the existence of the step.

Besides, reference numeral 43 designates a pixel electrode (cathode of the EL element) made of a conductive film with high reflectivity, and is electrically connected to the drain of the current controlling TFT 2403. As the pixel electrode 43, it is preferable to use a conductive film with low resistance, such as an aluminum alloy film, a copper alloy film or a silver alloy film, or a lamination film thereof. Of course, a laminate structure with another conductive film may be adopted. In addition, a light emitting layer is formed in a groove (corresponding to a pixel) formed by banks 44a and 44b made of insulating films (preferably resin). Note that, in this case, although only one pixel is shown, light-emitting layers corresponding to respective colors of R (red), G (green) and B (blue) may be separately formed. As an organic EL material used for the light-emitting layer, π-conjugated polymer material is used. As a typical polymer material, polyparaphenylene vinylene (PPV) based, polyvinylcarbazole (PVK) based, polyfluorene based and the like are enumerated.

Embodiment 4 adopts the self-emitting layer of a laminate structure in which a hole-injecting layer 46 made of PEDOT (polythiophene) or PAni (polyaniline) is provided on the light-emitting layer 45. An anode 47 made of a transparent conductive film is provided on the hole-injecting layer 46. In Embodiment 4, since light generated in the light-emitting layer 45 is radiated to an upper surface side (to the upper side of the TFT), the anode 47 must be translucent. As the transparent conductive film, a compound of indium oxide and tin oxide or a compound of indium oxide and zinc oxide can be used. However, since the anode 47 is formed after the light-emitting layer and the hole-injecting layer which have low heat resistance are formed, it is preferable to be able to form the anode 47 at temperature as low as possible.

FIG. 16B shows an example in which the structure of the self-emitting layer is reversed. A current controlling TFT 2601 is formed using a p-channel TFT 702 shown in FIG. 8. With respect to the manufacturing process thereof, reference may be made to Embodiment 1. In Embodiment 4, a transparent conductive film is used as a pixel electrode (anode) 50.

After banks 51a and 51b made of insulating films are formed, a light-emitting layer 52 made of polyvinylcarbazole is formed by solution application. An electron-injecting layer 53 made of potassium acetylacetonate (expressed as acacK), and a cathode 54 made of aluminum alloy are formed thereon. In this case, the cathode 54 functions also as a passivation film. In this way, an EL element 2602 is formed. In Embodiment 4, light generated in the light-emitting layer 53 is radiated, as indicated by an arrow, toward the substrate on which TFTs are formed. It is preferred that a current controlling TFT 2601 is formed using a p-channel TFT in the case of employing the structure.

Embodiment 5

The TFT formed by implementing the present invention can be used in various electro-optic apparatus, (typically active matrix type liquid crystal display). That is, the present invention can be implemented in all of electronic apparatus integrated with the electro-optic apparatus and the semiconductor circuit at display portions thereof.

As such electronic apparatus, there are pointed out a video camera, a digital camera, a projector (rear type or front type), a head mount display (goggle type display), a car navigation system, a car stereo, a personal computer, a portable information terminal (mobile computer, portable telephone or electronic book) and the like. Examples of these are shown in FIGS. 18, 19 and 20.

Figure 18A:
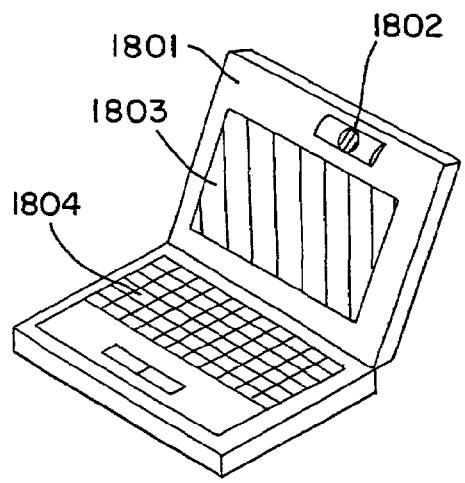
FIGS. 18A to 18F show various types of semiconductor devices of Embodiment 5.

FIG. 18A shows a personal computer including a main body 1801, an image input portion 1802, a display portion 1803 and a keyboard 1804. The invention is applicable to the display portion 1803 and other driver circuits.

Figure 18B:
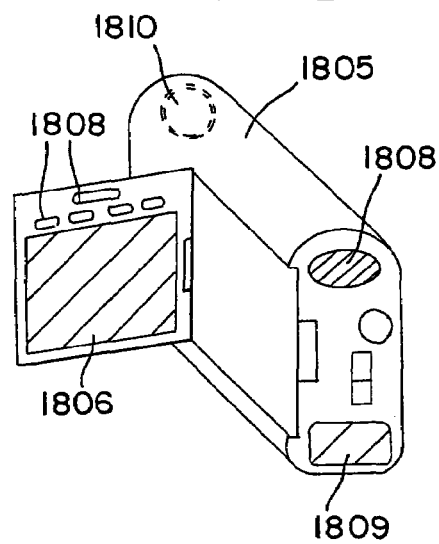

FIG. 18B shows a video camera including a main body 1805, a display portion 1806, a voice input portion 1807, operation switches 1808, a battery 1809 and an image receiving portion 1810. The invention is applicable to the display portion 1806 and other driver circuits.

Figure 18C:
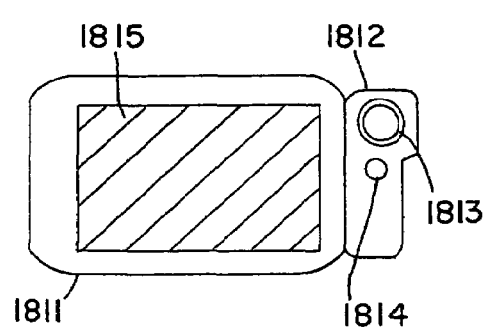

FIG. 18C shows a mobile computer including a main body 1811, a camera portion 1812, an image receiving portion 1813, an operation switch 1814 and a display portion 1815. The invention is applicable to the display portion 1815 and other driver circuits.

Figure 18D:
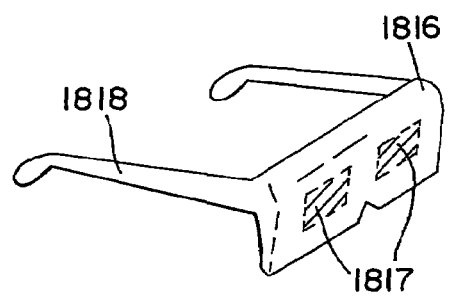

FIG. 18D shows a goggle type display including a main body 1816, a display portion 1817 and an arm portion 1818. The invention is applicable to the display portion 1817 and other driver circuits.

Figure 18E:
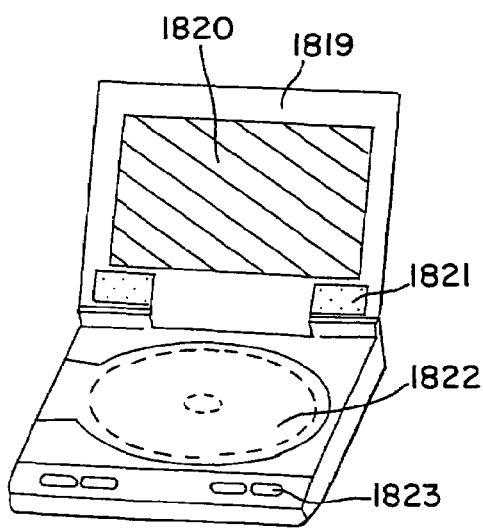

FIG. 18E shows a player using a record medium recorded with programs (hereinafter, referred to as record medium) including a main body 1820, a display portion 1820, a speaker portion 1821, a record medium 1822 and an operation switch 1823. The player uses DVD (digital Versatile Disc) or CD as the record medium and can enjoy music, enjoy movie and carry out game or Internet. The invention is applicable to the display portion 1820 and other driver circuits.

Figure 18F:
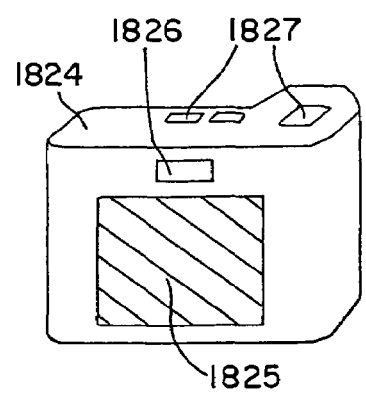

FIG. 18F shows a digital camera including a main body 1824, a display portion 1825, an eye contact portion 1826, operation switches 1827 and an image receiving portion (not illustrated). The invention is applicable to the display portion 1825 and other driver circuits.

Figure 19A:
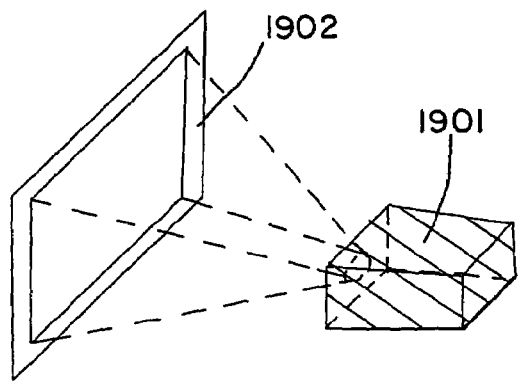
FIGS. 19A to 19D show various types of semiconductor devices of Embodiment 5.

FIG. 19A shows a front type projector including a projection apparatus 1901 and a screen 1902. The invention is applicable to a liquid crystal display apparatus 1914 constituting a portion of the projection apparatus 1901 and other driver circuits.

Figure 19B:
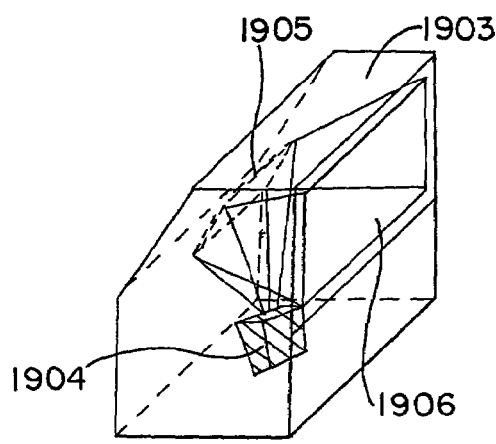

FIG. 19B shows a rear type projector including a main body 1903, a projection apparatus 1904, a mirror 1905 and a screen 1906. The invention is 10 applicable to a signal control circuit of the liquid crystal display apparatus 1914 constituting a portion of the projection apparatus 1904 and other driver circuits.

Figure 19C:
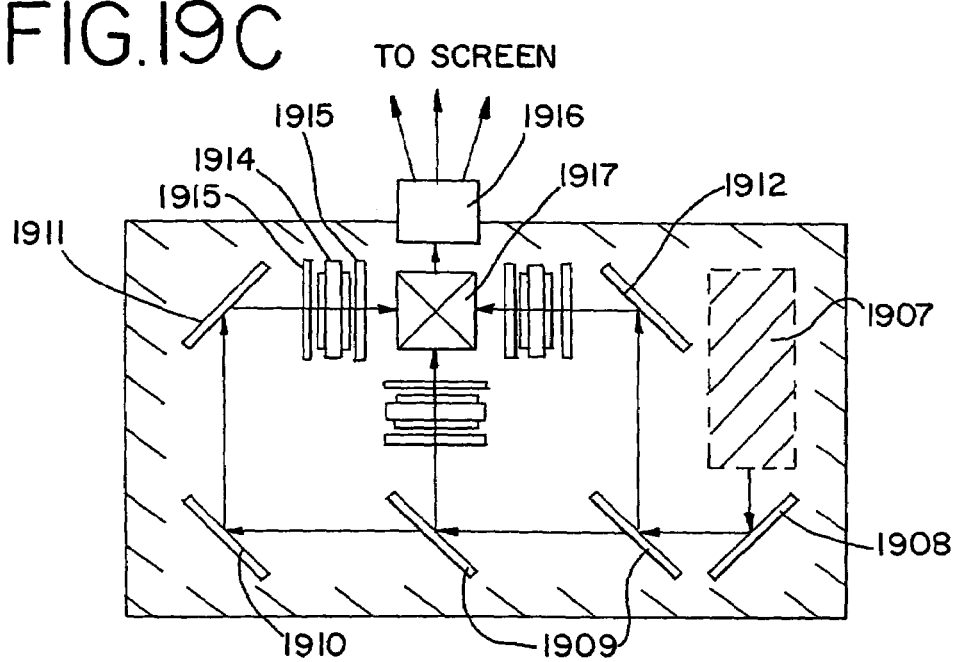

Further, FIG. 19C is a view showing an example of a structure of the projection apparatus 1901 and 1904 in FIG. 19A and FIG. 19B. The projection apparatus 1901 or 1904 is constituted by a light source optical system 1907, mirrors 1908, and 1910 through 1914, a dichroic mirror 1909, a prism 1913, a liquid crystal display apparatus 1914, a phase difference plate 1915 and a projection optical system 1916. The projection optical system 1916 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 19C.

Figure 19D:
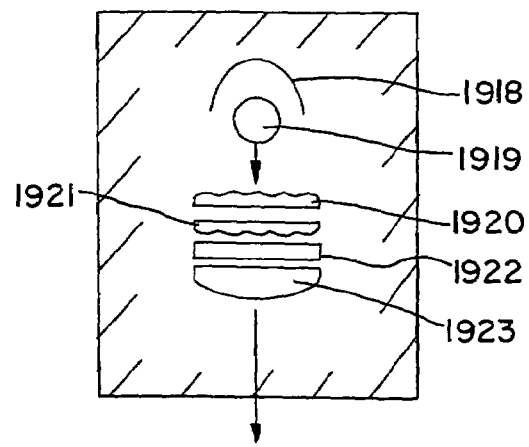

Further, FIG. 19D is a view showing an example of a structure of the light source optical system 1907 in FIG. 19C. According to the embodiment, the light source optical system 1907 is constituted by a reflector 1918, a light source 1919, lens arrays 1920 and 1921, a polarization conversion element 1922 and a focusing lens 1923. Further, the light source optical system shown in FIG. 19D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 19, there is shown a case of using a transmission type electro-optic apparatus and an example of applying a reflection type electro-optic apparatus is not illustrated.

Figure 20A:
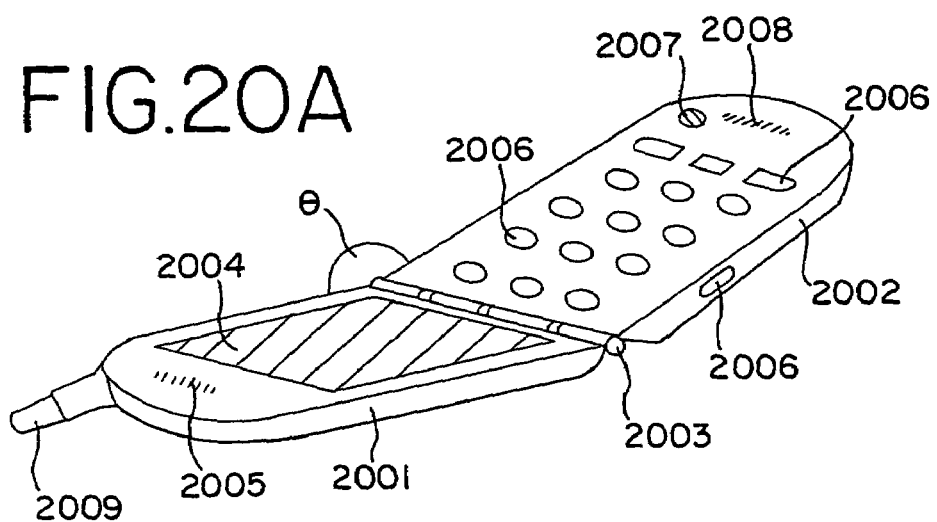
FIGS. 20A to 20C show various types of semiconductor devices of Embodiment 5.

FIG. 20A shows a portable telephone including a display panel 2001, an operation panel 2002, a connecting portion 2003, a display with a built-in sensor 2004, a voice output portion 2005, an operation key 2006, a power source switch 2007, a voice input portion 2008, and an antenna 2009. The invention is applicable to the display with a built-in sensor 2004, a voice output portion 2005, a voice input portion 2008 and other driver circuits.

Figure 20B:
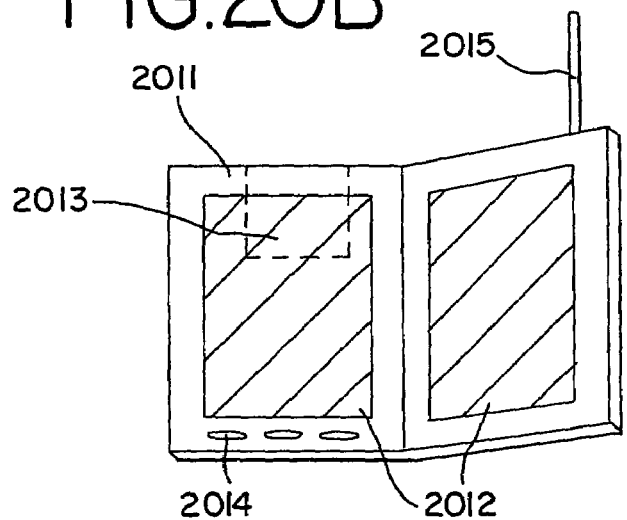

FIG. 20B shows a portable book (electronic book) including a main body 2011, display portion 2012, a record medium 2013, an operation switch 2014 and an antenna 2015. The invention is applicable to the display portion 2012, the record medium 2013 and other driver circuits.

Figure 20C:
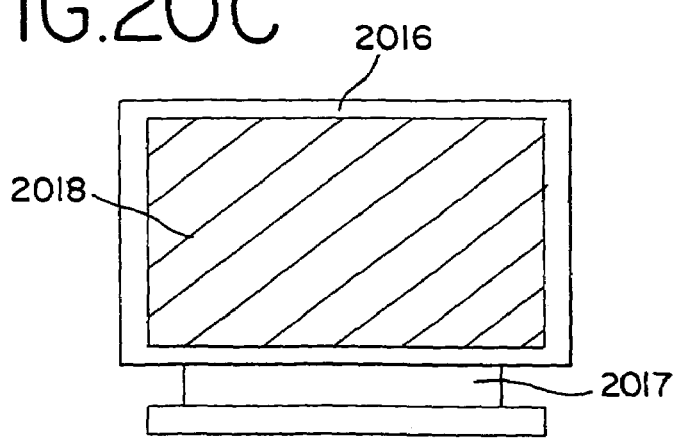

FIG. 20C shows a display including a main body 2016, a support base 2017 and a display portion 2018. The invention is applicable to the display portion 2018. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields.

According to the present invention, the satisfactory crystalline semiconductor film may be obtained even with the continuous formation from the formation of the amorphous semiconductor film through the formation of the base film in the same film forming chamber, and the manufacturing process of a TFT may be shortened drastically. Thus, mass production becomes possible. Further, the number of times of conveyance can be reduced according to the present invention, and contamination of the interface of the film during the conveyance can be prevented. Also, conveyance trouble and the like are reduced. Thus, reduction in yield can be suppressed.

What is claimed is:

1. A method of manufacturing a semiconductor device comprising the steps of:
   forming an insulating film over a substrate in a film forming chamber after the inside of the film forming chamber is cleaned with fluorine compound gas;
   introducing silane gas in the film forming chamber after forming the insulating film;
   generating plasma to form an amorphous semiconductor film comprising silicon with a fluorine concentration of $1 \times 10^{18}$ atoms/cm$^3$ or less on the insulating film after introducing the silane gas;
   crystallizing the amorphous semiconductor film by conducting a heating process,
   wherein after forming the insulating film, the amorphous semiconductor film is formed without exposure to an atmosphere.

2. A method of manufacturing a semiconductor device according to claim 1, wherein the insulating film comprises a material selected from the group consisting of a silicon oxide film, a silicon nitride film and a silicon oxide nitride film.

3. A method of manufacturing a semiconductor device according to claim 1, wherein temperature of the heating process is from 500° C. to 600° C.

4. A method of manufacturing a semiconductor device as claimed in claim 1, wherein, after cleaning the film forming chamber, a coating film constituted of one or a plurality of types of silicon selected from the group consisting of silicon oxide, silicon nitride, silicon oxide nitride, and silicon is deposited on the inside of the film forming chamber.

5. A method of manufacturing a semiconductor device as claimed in claim 4, wherein the coating film has a thickness of 1 μm or more.

6. A method of manufacturing a semiconductor device according to claim 1, wherein the laser light is a light selected from the group consisting of a pulse oscillation type or a continuous emission type excimer laser, a YAG laser and a YVO$_4$ laser.

7. A method of manufacturing a semiconductor device according to claim 1, wherein the fluorine compound gas is ClF$_3$ or NF$_3$.

8. A method of manufacturing a semiconductor device comprising the steps of:
   forming an insulating film over a substrate in a film forming chamber after the inside of the film forming chamber is cleaned with fluorine compound gas;
   introducing silane gas in the film forming chamber after forming the insulating film;
   generating plasma to form an amorphous semiconductor film comprising silicon with a fluorine concentration of $1 \times 10^{18}$ atoms/cm$^3$ or less on the insulating film after introducing silane gas;
   crystallizing the amorphous semiconductor film by conducting a heating process, and
   irradiating laser light to the crystallized semiconductor film,
   wherein after forming the insulating film, the amorphous semiconductor film is formed without exposure to an atmosphere.

9. A method of manufacturing a semiconductor device according to claim 8, wherein the insulating film comprises a material selected from the group consisting of a silicon oxide film, a silicon nitride film and a silicon oxide nitride film.

10. A method of manufacturing a semiconductor device according to claim 8, wherein temperature of the heating process is from 500° C. to 600° C.

11. A method of manufacturing a semiconductor device as claimed in claim 8, wherein, after cleaning the film forming chamber, a coating film constituted of one or a plurality of types of silicon selected from the group consisting of silicon oxide, silicon nitride, silicon oxide nitride, and silicon is deposited on the inside of the film forming chamber.

12. A method of manufacturing a semiconductor device as claimed in claim 11, wherein the coating film has a thickness of 1 μm or more.

13. A method of manufacturing a semiconductor device according to claim 8, wherein the fluorine compound gas is ClF$_3$ or NF$_3$.

14. A method of manufacturing a semiconductor device comprising the steps of:
   forming a first insulating film over a substrate in a film forming chamber after the inside of the film forming chamber is cleaned with fluorine compound gas;

forming a second insulating film on the first insulating film;

introducing silane gas in the film forming chamber after forming the second insulating film;

generating plasma to form an amorphous semiconductor film comprising silicon with a fluorine concentration of $1\times10^{18}$ atoms/cm$^3$ or less on the second insulating film after introducing the silane gas;

crystallizing the amorphous semiconductor film by conducting a heating process, wherein after forming the insulating film, the amorphous semiconductor film is formed without exposure to an atmosphere.

15. A method of manufacturing a semiconductor device according to claim 14, wherein the first insulating film is formed by using SiH$_4$, NH$_3$, N$_2$O and H$_2$, and the second insulating film is formed by using SiH$_4$ and N$_2$O.

16. A method of manufacturing a semiconductor device as claimed in claim 15, wherein the coating film has a thickness of 1 μm or more.

17. A method of manufacturing a semiconductor device according to claim 14, wherein temperature of the heating process is from 500° C. to 600° C.

18. A method of manufacturing a semiconductor device as claimed in claim 14, wherein, after cleaning the film forming chamber, a coating film constituted of one or a plurality of types of silicon selected from the group consisting of silicon oxide, silicon nitride, silicon oxide nitride, and silicon is deposited on the inside of the film forming chamber.

19. A method of manufacturing a semiconductor device according to claim 14, wherein the fluorine compound gas is ClF$_3$ or NF$_3$.

20. A method of manufacturing a semiconductor device comprising the steps of:

forming a first insulating film over a substrate in a film forming chamber after the inside of the film forming chamber is cleaned with fluorine compound gas;

forming a second insulating film on the first insulating film;

introducing silane gas in the film forming chamber after forming the second insulating film;

generating plasma to form an amorphous semiconductor film comprising silicon with a fluorine concentration of $1\times10^{18}$ atoms/cm$^3$ or less on the second insulating film after introducing silane gas;

crystallizing the amorphous semiconductor film by conducting a heating process; and irradiating laser light to the crystallized semiconductor film, wherein after forming the second insulating film, the amorphous semiconductor film is formed without exposure to an atmosphere.

21. A method of manufacturing a semiconductor device according to claim 20, wherein the first insulating film is formed by using SiH$_4$, NH$_3$, N$_2$O and H$_2$, and the second insulating film is formed by using SiH$_4$ and N$_2$O.

22. A method of manufacturing a semiconductor device according to claim 20, wherein temperature of the heating process is from 500° C. to 600° C.

23. A method of manufacturing a semiconductor device as claimed in claim 20, wherein, after cleaning the film forming chamber, a coating film constituted of one or a plurality of types of silicon selected from the group consisting of silicon oxide, silicon nitride, silicon oxide nitride, and silicon is deposited on the inside of the film forming chamber.

24. A method of manufacturing a semiconductor device as claimed in claim 23, wherein the coating film has a thickness of 1 μm or more.

25. A method of manufacturing a semiconductor device according to claim 20, wherein the laser light is a light selected from the group consisting of a pulse oscillation type or a continuous emission type excimer laser, a YAG laser and a YVO$_4$ laser.

26. A method of manufacturing a semiconductor device according to claim 20, wherein the fluorine compound gas is ClF$_3$ or NF$_3$.

* * * * *